United States Patent
Ahn

(10) Patent No.: US 9,245,920 B2
(45) Date of Patent: Jan. 26, 2016

(54) METHODS OF DRIVING IMAGE SENSORS INCLUDING UNIT PIXELS HAVING PHOTOELECTRIC CONVERSION AND FLOATING DIFFUSION REGIONS

(71) Applicant: Samsung Electronics Co., Ltd., Suwon-Si, Gyeonggi-Do (KR)

(72) Inventor: Jung-Chak Ahn, Yongin-si (KR)

(73) Assignee: SAMSUNG ELECTRONICS CO., LTD., Gyeonggi (KR)

( * ) Notice: Subject to any disclaimer, the term of this patent is extended or adjusted under 35 U.S.C. 154(b) by 312 days.

(21) Appl. No.: 13/757,925

(22) Filed: Feb. 4, 2013

(65) Prior Publication Data
US 2013/0248685 A1   Sep. 26, 2013

(30) Foreign Application Priority Data
Mar. 21, 2012 (KR) .................... 10-2012-0028559

(51) Int. Cl.
| H04N 3/14 | (2006.01) |
| H01L 27/146 | (2006.01) |
| H04N 5/355 | (2011.01) |
| H04N 5/374 | (2011.01) |

(52) U.S. Cl.
CPC ........ *H01L 27/14665* (2013.01); *H04N 5/3559* (2013.01); *H04N 5/35572* (2013.01); *H04N 5/374* (2013.01)

(58) Field of Classification Search
CPC ................ H01L 27/14609; H01L 27/14643; H04N 3/155; H04N 5/3532; H04N 5/351
See application file for complete search history.

(56) References Cited

U.S. PATENT DOCUMENTS

| 6,486,504 B1 | 11/2002 | Guidash |
| 6,710,804 B1 | 3/2004 | Guidash |
| 7,605,855 B2 | 10/2009 | Wang et al. |
| 8,830,371 B2 * | 9/2014 | Ueda ............................ 348/308 |
| 2006/0103749 A1 | 5/2006 | He |

FOREIGN PATENT DOCUMENTS

| JP | 2001203940 A | 7/2001 |
| KR | 1020070113608 A | 11/2007 |

\* cited by examiner

*Primary Examiner* — Tony Ko
(74) *Attorney, Agent, or Firm* — Harness, Dickey & Pierce, PLC

(57) ABSTRACT

A method of driving an image sensor including a plurality of unit pixels, each unit pixel having photoelectric conversion and floating diffusion regions, may include resetting a potential level of the floating diffusion region by a first voltage level, the first voltage level being lower than a power supply voltage; converting incident light into electrical charges in the photoelectric conversion region; and accumulating at least one of collected, first overflowed, and second overflowed electrical charges in the floating diffusion region based on the incident light, the collected electrical charges indicating electrical charges that are collected in the photoelectric conversion region, the first overflowed electrical charges indicating charges overflowed from the photoelectric conversion region within potential well capacity of the floating diffusion region, and the second overflowed electrical charges indicating charges overflowed from the photoelectric conversion region over the potential well capacity of the floating diffusion region.

13 Claims, 15 Drawing Sheets

METHODS OF DRIVING IMAGE SENSORS INCLUDING UNIT PIXELS HAVING PHOTOELECTRIC CONVERSION AND FLOATING DIFFUSION REGIONS

CROSS-REFERENCE TO RELATED APPLICATION(S)

This application claims priority from Korean Patent Application No. 10-2012-0028559, filed on Mar. 21, 2012, in the Korean Intellectual Property Office (KIPO), the entire contents of which are incorporated herein by reference.

BACKGROUND

1. Technical Field

Example embodiments may relate to image sensors. Example embodiments also may relate to methods of driving image sensors.

2. Description of the Related Art

An image sensor receives incident light, converts the incident light into electrical charges, and outputs an electrical signal corresponding to the electrical charges. A dynamic range (DR) of the image sensor represents the capability of the image sensor to distinguish various levels of brightness for a pixel between maximum brightness and minimum brightness. As semiconductor process technology continues to develop, various methods have been proposed to increase the dynamic range of the image sensor.

SUMMARY

Some example embodiments may provide methods of driving image sensors.

Some example embodiments may provide methods of driving image sensors capable of having wide dynamic range and/or improved performances.

In some example embodiments, a method of driving an image sensor including a plurality of unit pixels, each unit pixel having a photoelectric conversion region and a floating diffusion region may comprise resetting a potential level of the floating diffusion region by a first voltage level during a reset mode, the first voltage level being lower than a level of a power supply voltage; converting incident light into electrical charges in the photoelectric conversion region during an integration mode; and/or accumulating at least one of collected electrical charges, first overflowed electrical charges, and second overflowed electrical charges in the floating diffusion region based on illuminance of the incident light, the collected electrical charges indicating electrical charges that are collected in the photoelectric conversion region, the first overflowed electrical charges indicating electrical charges that have overflowed from the photoelectric conversion region and are within potential well capacity of the floating diffusion region, and the second overflowed electrical charges indicating electrical charges that have overflowed from the photoelectric conversion region and are over the potential well capacity of the floating diffusion region.

In some example embodiments, each unit pixel may further include a reset gate that resets the floating diffusion region in response to a reset signal. A difference between the first voltage level and a shut-off voltage level of the reset gate may be fixed by a value in each unit pixel. The shut-off voltage level may indicate a potential level of the reset gate when the reset signal corresponds to a logic low level.

In some example embodiments, accumulating at least one of the collected electrical charges, the first overflowed electrical charges, and the second overflowed electrical charges may include selectively accumulating at least one of the first overflowed electrical charges and the second overflowed electrical charges in the floating diffusion region based on the illuminance of the incident light during the integration mode; and/or accumulating the collected electrical charges in the floating diffusion region during a readout mode after the integration mode.

In some example embodiments, selectively accumulating at least one of the first overflowed electrical charges and the second overflowed electrical charges may include maintaining the potential level of the floating diffusion region at the first voltage level when the illuminance of the incident light is lower than a first reference illuminance; accumulating the first overflowed electrical charges in the floating diffusion region when the illuminance of the incident light is higher than the first reference illuminance and is lower than a second reference illuminance; and/or accumulating the first overflowed electrical charges and the second overflowed electrical charges in the floating diffusion region when the illuminance of the incident light is higher than the second reference illuminance.

In some example embodiments, accumulating the collected electrical charges may include resetting the potential level of the floating diffusion region by the first voltage level during a first period of the readout mode; and/or transferring the collected electrical charges from the photoelectric conversion region to the floating diffusion region during a second period of the readout mode.

In some example embodiments, the method of may further comprise providing an image signal corresponding to the illuminance of the incident light based on at least one of the collected electrical charges, the first overflowed electrical charges, and the second overflowed electrical charges during a readout mode after the integration mode.

In some example embodiments, providing the image signal may include generating a first output signal by sampling the potential level of the floating diffusion region during a first sampling period of the readout mode; generating a reference signal by sampling the potential level of a reset state of the floating diffusion region during a second sampling period of the readout mode; generating a second output signal by sampling the potential level of the floating diffusion region during a third sampling period of the readout mode; and/or generating the image signal based on the reference signal, the first output signal, and the second output signal.

In some example embodiments, generating the image signal may include generating a first sampling signal by performing correlated double sampling on the reference signal and the first output signal; generating a second sampling signal by performing the correlated double sampling on the reference signal and the second output signal; and/or generating the image signal by adding the first sampling signal to the second sampling signal.

In some example embodiments, each unit pixel may further include a reset gate and a transfer gate. The potential level of the floating diffusion region may be reset by the first voltage level in response to a reset signal using the reset gate, the reset signal being activated during a first period of the readout mode between the first sampling period and the second sampling period. The collected electrical charges may be transferred from the photoelectric conversion region to the floating diffusion region in response to a transfer signal using the transfer gate, the transfer signal being activated during a second period of the readout mode between the second sampling period and the third sampling period.

In some example embodiments, the reset signal and/or the transfer signal may be deactivated during the first sampling period, the second sampling period, and/or the third sampling period.

In some example embodiments, the first output signal may correspond to the potential level of the reset state of the floating diffusion region when the illuminance of the incident light is lower than a first reference illuminance, may correspond to the first overflowed electrical charges when the illuminance of the incident light is higher than the first reference illuminance and is lower than a second reference illuminance, and/or may correspond to the first overflowed electrical charges and the second overflowed electrical charges when the illuminance of the incident light is higher than the second reference illuminance.

In some example embodiments, the second output signal may correspond to the collected electrical charges.

In some example embodiments, the method further comprise processing the image signal by dividing responses of the image sensor into a linear response and a logarithmic response according to a level of the image signal.

In some example embodiments, processing the image signal may include processing the image signal based on the linear response when the level of the image signal is lower than a reference level corresponding to the second reference illuminance; and/or processing the image signal based on the linear response and the logarithmic response when the level of the image signal is higher than the reference level.

In some example embodiments, a dynamic range of the image sensor may be controlled by adjusting a start time point of the reset mode.

In some example embodiments, a method of driving an image sensor that includes a plurality of unit pixels, each unit pixel including a photoelectric conversion region and a floating diffusion region may comprise resetting a potential level of the floating diffusion region by a first voltage level, the first voltage level being lower than a level of a power supply voltage; after resetting the potential level of the floating diffusion region, converting incident light into electrical charges in the photoelectric conversion region; and/or accumulating at least one of collected electrical charges, first overflowed electrical charges, and second overflowed electrical charges in the floating diffusion region based on illuminance of the incident light. The collected electrical charges may indicate electrical charges collected in the photoelectric conversion region. The first overflowed electrical charges may indicate electrical charges overflowed from the photoelectric conversion region that are within a potential well capacity of the floating diffusion region. The second overflowed electrical charges may indicate electrical charges overflowed from the photoelectric conversion region that are not within the potential well capacity of the floating diffusion region.

In some example embodiments, a dynamic range of the image sensor may be controlled by adjusting a start time point of the resetting of the potential level of the floating diffusion region.

In some example embodiments, a dynamic range of the image sensor may be controlled by adjusting a duration of the resetting of the potential level of the floating diffusion region.

In some example embodiments, a dynamic range of the image sensor may be controlled by adjusting an end time point of the resetting of the potential level of the floating diffusion region.

In some example embodiments, the method may further comprise, after accumulating at least one of the collected electrical charges, the first overflowed electrical charges, and the second overflowed electrical charges in the floating diffusion region, providing an image signal corresponding to the illuminance of the incident light based on the at least one of the collected electrical charges, the first overflowed electrical charges, and the second overflowed electrical charges during a readout mode after the integration mode.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Figure 1:
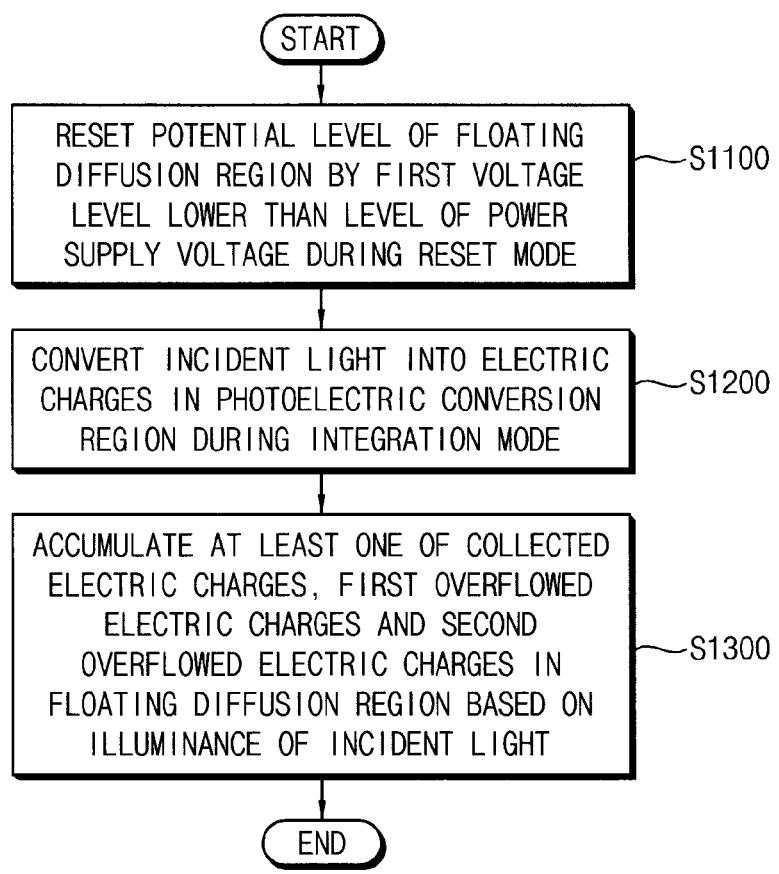
FIG. 1 is a flow chart illustrating a method of driving an image sensor according to some example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

FIG. 1 is a flow chart illustrating a method of driving an image sensor according to some example embodiments.

The method illustrated in FIG. 1 may be applied to drive an image sensor including a plurality of unit pixels each of which has a photoelectric conversion region (e.g., a photodiode) and a floating diffusion region. Hereinafter, the method of driving the image sensor according to some example embodiments will be described based on a complementary metal-oxide semiconductor (CMOS) image sensor. However, the method of driving the image sensor according to some example embodiments may be applied to drive a charge-coupled device (CCD) image sensor. Detailed configurations of a CMOS image sensor and a unit pixel will be described below with reference to FIGS. 2, 3, and 4.

The CMOS image sensor may operate alternatively in three modes, that is, a first operation mode, a second operation mode and a third operation mode. The first operation mode may be referred to as a reset mode, the second operation mode may be referred to as an integration mode and the third operation mode may be referred to as a readout mode. The CMOS image sensor may perform different operations depending on the operation modes. For example, during the reset mode, the floating diffusion region is reset. During the integration mode, image information on an object to be captured is obtained by collecting charge carriers (e.g., electron-hole pairs) in the photoelectric conversion regions proportional to intensity of incident light through an open shutter of the CMOS image sensor. During the readout mode after the integration mode, the shutter is closed, and the image information in a form of charge carriers is converted into electrical signals.

Referring to FIG. 1, in the method of driving the image sensor according to some example embodiments, a potential level of the floating diffusion region is reset by a first voltage level during the reset mode before the integration mode (step S1100). The first voltage level is lower than a level of a power supply voltage. Incident light is converted into electrical charges in the photoelectric conversion region during the integration mode (step S1200). At least one of collected electrical charges, first overflowed electrical charges, and second overflowed electrical charges is accumulated in the floating diffusion region based on illuminance of the incident light (step S1300). The step S1300 will be described below with reference to FIGS. 9, 10, and 11.

The collected electrical charges indicate electrical charges that are generated in the photoelectric conversion region based on the incident light and are collected in the photoelectric conversion region. The first overflowed electrical charges and the second overflowed electrical charges indicate electrical charges that are generated in the photoelectric conversion region based on the incident light and have overflowed from the photoelectric conversion region. As will be described below with reference to FIGS. 6, 7, and 8, the first overflowed electrical charges are within potential well capacity (e.g., charge storage capacity) of the floating diffusion region, and the second overflowed electrical charges are over the potential well capacity of the floating diffusion region.

To increase a dynamic range, a conventional image sensor includes photoelectric conversion regions that have relatively large charge storage capacity. For example, the photoelectric conversion regions in the conventional image sensor may have relatively large size or may be relatively heavily doped with impurities. The conventional image sensor, however, has some limit to increase the dynamic range. Particularly, when the photoelectric conversion regions have relatively large size, a size and manufacturing cost of the conventional image sensor may be relatively great. When the photoelectric conversion regions are relatively heavily doped with impurities, a dark level (i.e., black level) performance of the conventional image sensor may be degraded because a dark current increases due to the relatively large charge storage capacity. An image lag phenomenon may occur in the conventional image sensor due to electrical charges that are not transferred to the floating diffusion region and remain in the photoelectric conversion region.

In the method of driving the image sensor according to some example embodiments, at least one of the collected electrical charges, the first overflowed electrical charges and the second overflowed electrical charges is accumulated in the floating diffusion region. At least one of the first overflowed electrical charges and the second overflowed electrical charges may be selectively accumulated in the floating diffusion region based on the illuminance of the incident light during the integration mode. Thus, the image sensor operated by the method according to some example embodiments may have relatively wide dynamic range and improved performance. In addition, since the potential level of the floating diffusion region is reset by the first voltage level lower than the level of the power supply voltage (e.g., a soft reset scheme), the second overflowed electrical charges that are over the potential well capacity of the floating diffusion region as well as the first overflowed electrical charges that are within the potential well capacity of the floating diffusion region may be effectively accumulated in the floating diffusion region.

Hereinafter, the method of driving the image sensor according to some example embodiments will be explained in detail with reference to example configurations of the CMOS image sensor and the unit pixel.

Figure 2:
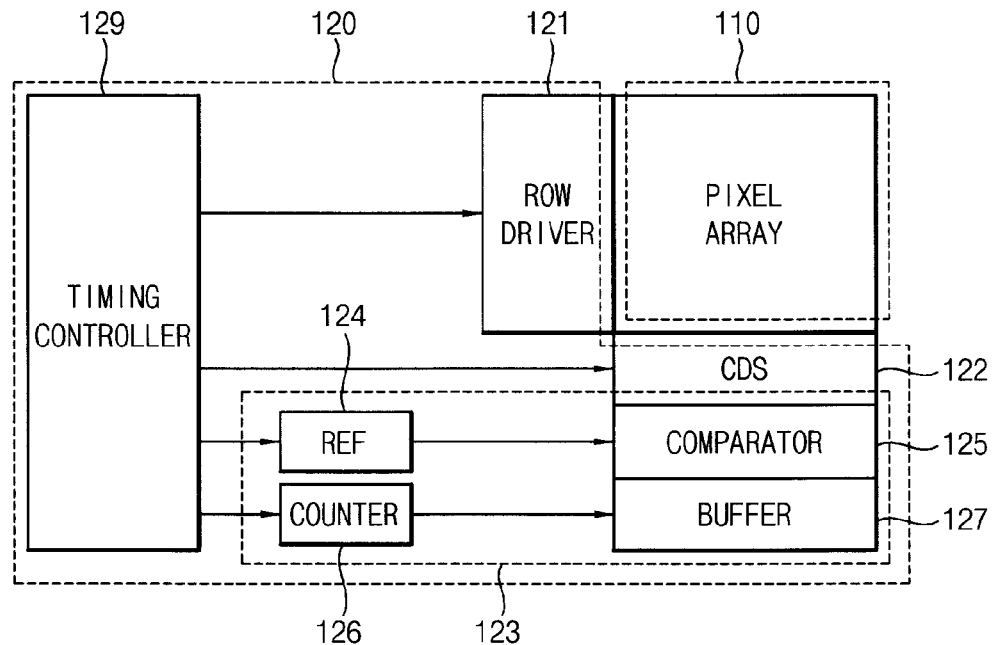
FIG. 2 is a block diagram illustrating a CMOS image sensor for describing the method of driving the image sensor according to some example embodiments.

FIG. 2 is a block diagram illustrating a CMOS image sensor for describing the method of driving the image sensor according to some example embodiments.

Referring to FIG. 2, a CMOS image sensor 100 includes a pixel array 110 and a signal processing unit 120.

The pixel array 110 generates an electrical signal based on incident light. The pixel array 110 may include a plurality of unit pixels that are arranged in a matrix form. Detailed configurations of each unit pixel will be described below with reference to FIGS. 3 and 4. The pixel array 110 may further include an infrared filter and/or a color filter.

The signal processing unit 120 generates an image signal based on the electrical signal. The signal processing unit 120 may include a row driver 121, a correlated double sampling (CDS) unit 122, an analog-digital converting (ADC) unit 123 and a timing controller 129.

The row driver 121 is connected with each row of the pixel array 110. The row driver 121 may generate driving signals to drive each row. For example, the row driver 121 may drive the plurality of unit pixels included in the pixel array 110 row by row.

The CDS unit 122 performs a CDS operation (e.g., analog double sampling (ADS)) by obtaining a difference between reset components and measured signal components using capacitors and switches, and outputs analog signals corresponding to effective signal components. The CDS unit 122 may include a plurality of CDS circuits that are connected to column lines, respectively. The CDS unit 122 may output the analog signals corresponding to the effective signal components column by column.

The ADC unit 123 converts the analog signals corresponding to the effective signal components into digital signals. The ADC unit 123 may include a reference signal generator 124, a comparison unit 125, a counter 126 and a buffer unit 127. The reference signal generator 124 may generate a reference signal (e.g., a ramp signal having a slope), and provide the reference signal to the comparison unit 125. The comparison unit 125 may compare the reference signal with the analog signals corresponding to the effective signal components, and output comparison signals having respective transition timings according to respective effective signal components column by column. The counter 126 may perform a counting operation to generate counting signals, and provide the counting signals to the buffer unit 127. The buffer unit 127 may include a plurality of latch circuits (e.g., static random access memory (SRAM)) respectively connected to the column lines. The buffer unit 127 may latch the counting signal of each column line in response to the transition of each comparison signal, and output the latched counting signal as the image signal.

In some example embodiments, the ADC unit 123 may further include an adder circuit that adds the analog signals output from the CDS unit 122. The buffer unit 127 may include a plurality of single line buffers.

The timing controller 129 controls operation timings of the row driver 121, the CDS unit 122, and the ADC unit 123. The timing controller 129 may provide timing signals and control signals to the row driver 121, the CDS unit 122, and the ADC unit 123.

In some example embodiments, the CMOS image sensor 100 may perform a digital double sampling (DDS) as the CDS. For DDS, the reset signal and the measured signal may be both converted to respective digital signals. The final image signal may be determined from a difference of such respective digital signals.

Figure 3:
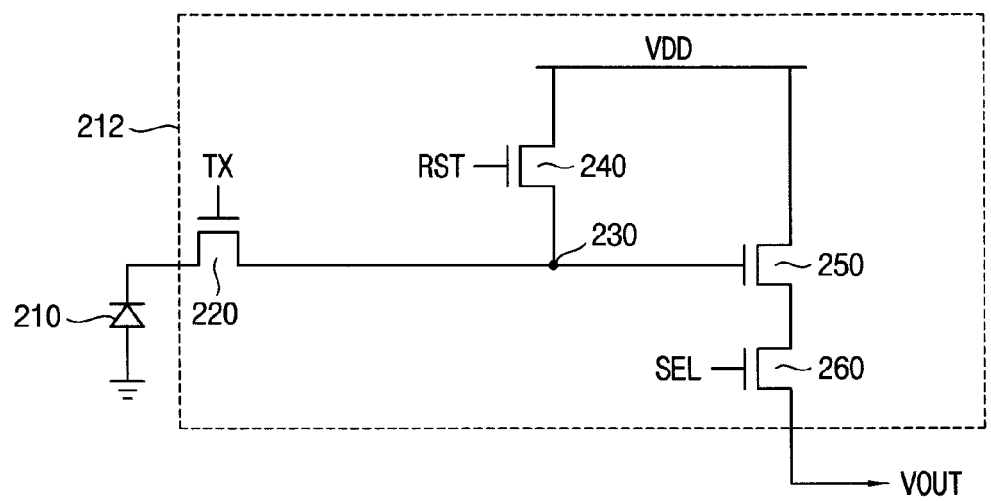
FIG. 3 is a circuit diagram illustrating an example of a unit pixel included in the CMOS image sensor of FIG. 2.

FIG. 3 is a circuit diagram illustrating an example of a unit pixel included in the CMOS image sensor of FIG. 2.

Referring to FIG. 3, a unit pixel 200 may include a photoelectric conversion unit 210 and a signal generation unit 212.

The photoelectric conversion unit 210 performs a photoelectric conversion operation. For example, the photoelectric conversion unit 210 may convert the incident light into the electrical charges during the integration mode. The photoelectric conversion unit 210 may include, for example, a photo diode, a photo transistor, a photo gate, a pinned photo diode (PPD), or a combination thereof.

The signal generation unit 212 generates the electrical signal based on the electrical charges generated by the photoelectric conversion operation. The unit pixel 200 may have various structures including, for example, one-transistor structure, three-transistor structure, four-transistor structure, five-transistor structure, structure where some transistors are shared by a plurality of unit pixels, etc. As illustrated in FIG. 3, the unit pixel 200 may have four-transistor structure. In this case, the signal generation unit 212 may include a transfer transistor 220, a reset transistor 240, a drive transistor 250, a select transistor 260 and a floating diffusion node 230.

The transfer transistor 220 may include a first electrode connected to the photoelectric conversion unit 210, a second electrode connected to the floating diffusion node 230, and a gate electrode applied to a transfer signal TX. The reset transistor 240 may include a first electrode applied to a power supply voltage VDD, a second electrode connected to the floating diffusion node 230, and a gate electrode applied to a reset signal RST. The drive transistor 250 may include a first electrode applied to the power supply voltage VDD, a gate electrode connected to the floating diffusion node 230, and a second electrode. The select transistor 260 may include a first electrode connected to the second electrode of the drive transistor 250, a gate electrode applied to a select signal SEL, and a second electrode providing an output voltage VOUT. A logic high level of the transfer signal TX and a logic high level of the select signal SEL may be higher than or substantially the same as a level of the power supply voltage VDD. A logic high level of the reset signal RST may be lower than or substantially the same as the level of the power supply voltage VDD depending on a type of the reset transistor 240.

Although the unit pixel 200 having four-transistor structure is illustrated in FIG. 3 for convenience of illustration, the unit pixel included in the CMOS image sensor may have various structures that include the photoelectric conversion unit and the floating diffusion node.

Figure 4:
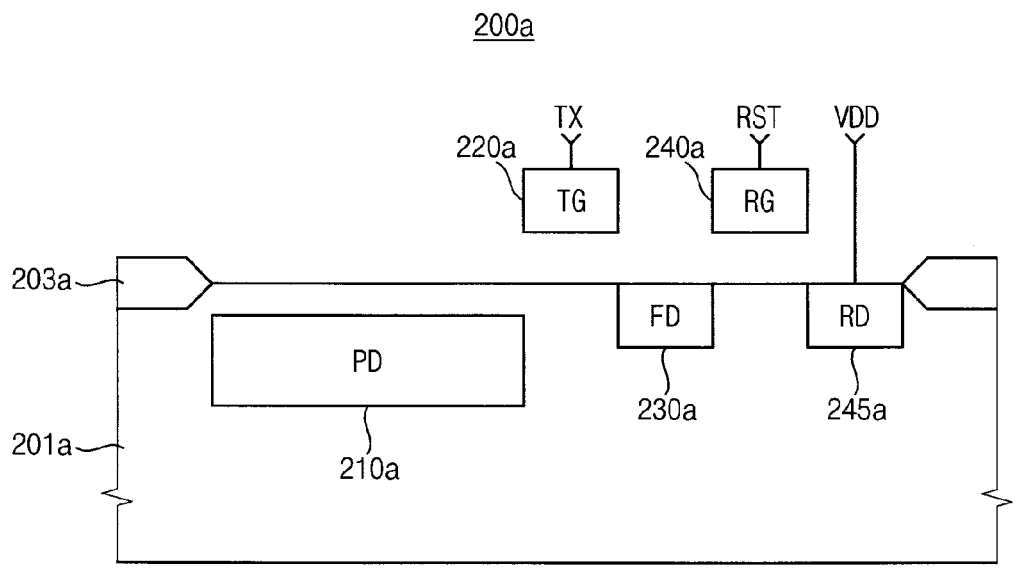
FIG. 4 is a cross-sectional view illustrating an example of a unit pixel included in the CMOS image sensor of FIG. 2.

FIG. 4 is a cross-sectional view illustrating an example of a unit pixel included in the CMOS image sensor of FIG. 2.

Referring to FIG. 4, the unit pixel 200a may include a semiconductor substrate 201a, a photoelectric conversion region (PD) 210a, a transfer gate (TG) 220a, a floating diffusion region (FD) 230a, a reset gate (RG) 240a and a reset drain region (RD) 245a. The photoelectric conversion region 210a, the transfer gate 220a, the floating diffusion region 230a and the reset gate 240a in FIG. 4 may correspond to the photoelectric conversion unit 210, the transfer transistor 220, the floating diffusion node 230, and the reset transistor 240 in FIG. 3, respectively. For convenience of illustration, elements that correspond to the drive transistor 250 and the select transistor 260 in FIG. 3 may be omitted in FIG. 4.

Although not illustrated in FIG. 4, the semiconductor substrate 201a may include a bulk substrate (not shown) and an epitaxial layer (not shown) formed over the bulk substrate. For example, the epitaxial layer may be doped with p-type impurities such that doping density of the epitaxial layer may gradually decrease in a direction to a surface where gates 220a and 240a are overlain.

The photoelectric conversion region 210a is formed in the semiconductor substrate 201a. The collected electrical charges may be generated in the photoelectric conversion region 210a by collecting electrical charges (e.g., electrons) from electron-hole pairs generated by the incident light on the semiconductor substrate 201a. When the illuminance of the incident light is higher than a desired (or alternatively, predetermined) illuminance (i.e., a threshold illuminance), the number of the electrical charges generated by the incident light may be larger than the number of electrical charges corresponding to the charge storage capacity of the photoelectric conversion region 210a, and thus the overflowed electrical charges (e.g., the first and second overflowed electrical charges) may be generated.

The photoelectric conversion region 210a may be formed in the semiconductor substrate 201a by an ion implantation process. The photoelectric conversion region 210a may be doped with impurities (e.g., n-type impurities) of an opposite conductivity type to that of the semiconductor substrate 201a. In some example embodiments, the photoelectric conversion region 210a may be lightly doped with the impurities and may have relatively small charge storage capacity. In other words, a doping density of the photoelectric conversion region 210a may be lower than a doping density of a photoelectric conversion region in a conventional image sensor, and thus the image sensor including the photoelectric conversion region 210a may have improved dark level performance. In some example embodiments, the photoelectric conversion region 210a may be formed by laminating a plurality of doped regions.

The transfer gate 220a is formed over the semiconductor substrate 201a. The transfer gate 220a may be disposed between the photoelectric conversion region 210a and the floating diffusion region 230a. The transfer gate 220a may transfer the electrical charges collected by the photoelectric conversion region 210a to the floating diffusion region 230a in response to the transfer signal TX. A contact (not shown) may be formed on the transfer gate 220a for receiving the transfer signal TX.

The floating diffusion region 230a is formed in the semiconductor substrate 201a. The floating diffusion region 230a may be doped with the impurities (e.g., n-type impurities) of a same conductivity type to that of the photoelectric conversion region 210a and may be doped with higher doping density than the photoelectric conversion region 210a. When some electrical charges are overflowed from the photoelectric conversion region 210a due to the incident light having a relatively high illuminance, the overflowed electrical charges may be accumulated in the floating diffusion region 230a during the integration mode. The collected electrical charges may be accumulated in the photoelectric conversion region 210a during the readout mode. A contact (not shown) may be formed on the floating diffusion region 230a for connecting to the drive transistor 250 in FIG. 3.

In some example embodiments, the floating diffusion region 230a may have a structure for reducing a leakage current, which is referred to as a low dark level structure. In the conventional CMOS image sensor, the floating diffusion region has a dark level that is much higher than (e.g., at least ten times as high as) a dark level of the photoelectric conversion region. In the CMOS image sensor operated by the method according to some example embodiments, a dark level of the floating diffusion region 230a may be substantially the same as a dark level of the photoelectric conversion region 210a. In other words, the dark level of the floating diffusion region 230a may be lower than the dark level of the floating diffusion region in the conventional CMOS image sensor.

The reset gate 240a is formed over the semiconductor substrate 201a. The reset gate 240a may be disposed between the floating diffusion region 230a and a reset drain region 245a receiving the power supply voltage VDD. As will be described below with reference to FIG. 5A, the reset gate 240a may reset the potential level of the floating diffusion region 230a by a first voltage level V1 in response to the reset signal RST. After the reset operation, the potential level (i.e., a voltage level) of the floating diffusion region 230a may be lower than the level of the power supply voltage VDD. A contact (not shown) may be formed on the reset gate 240a for receiving the reset signal RST, and a contact (not shown) may be formed on the reset drain region 245a for receiving the power supply voltage VDD.

In some example embodiments, isolation regions 203a may be formed among the plurality of unit pixels. The isolation regions 203a may be formed using a field oxide (FOX) by a shallow trench isolation (STI) process or a local oxidation of silicon (LOCOS) process. Although not illustrated in FIG. 4, a dielectric layer (not shown) including the gates 220a and 240a may be formed over the semiconductor substrate 201a.

As will be described below with reference to FIGS. 7 and 8, when the illuminance of the incident light is higher than the predetermined illuminance, the overflowed electrical charges may be transferred from the photoelectric conversion region 210a, via a charge transfer path (not illustrated) to the floating diffusion region 230a. The charge transfer path may be formed in the semiconductor substrate 201a between the photoelectric conversion region 210a and the floating diffusion region 230a. For example, when the photoelectric conversion region 210a and the floating diffusion region 230a are formed in the semiconductor substrate 201a by ion implantation process, the charge transfer path may be formed in the bulk of the semiconductor substrate 201a by adjusting an incident angle of an ion beam and a level of an ion energy.

FIGS. 5A, 5B, 6, 7, and 8 are diagrams for describing operations of the unit pixel of FIG. 4 operated by the method of FIG. 1.

Figure 5A:
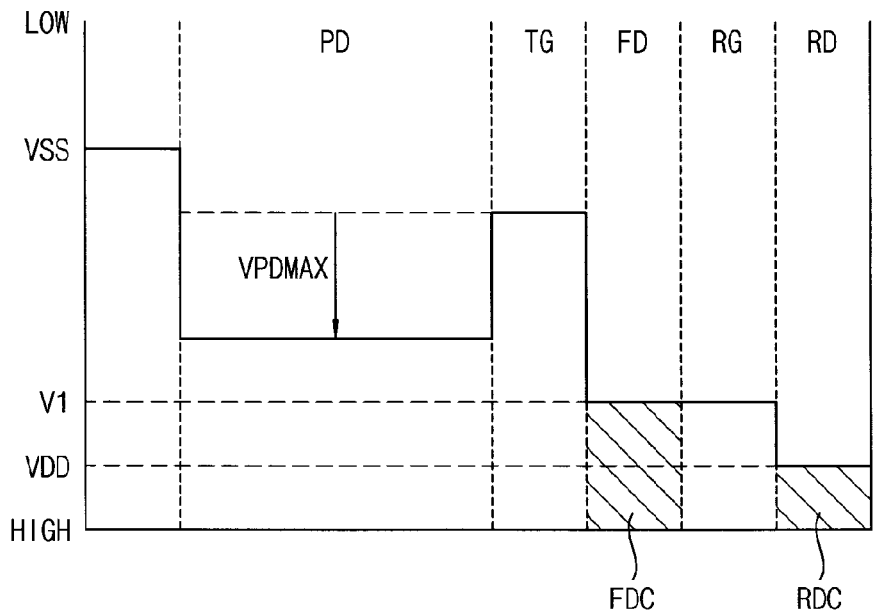
FIGS. 5A, 5B, 6, 7, and 8 are diagrams for describing operations of the unit pixel of FIG. 4 operated by the method of FIG. 1.
Figure 5B:
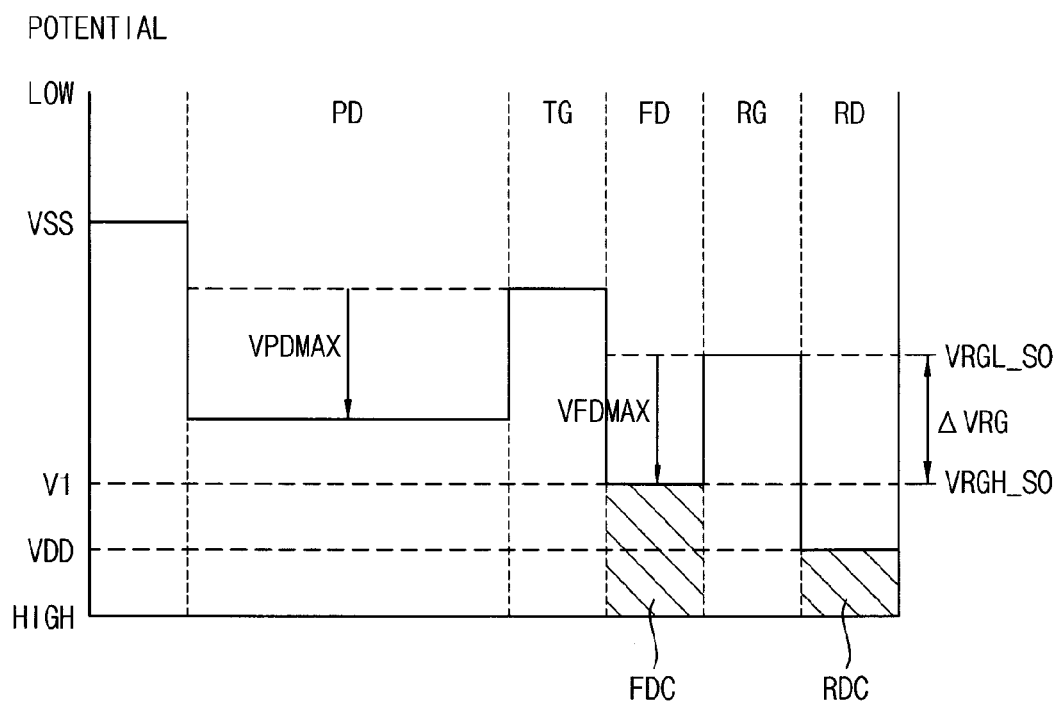
Figure 6:
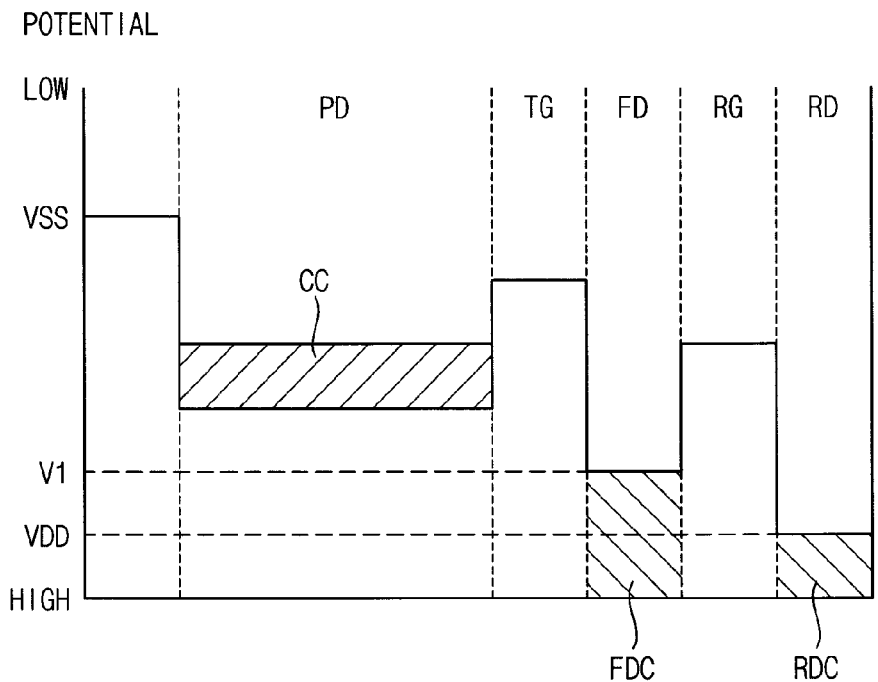

FIG. 5A is a diagram illustrating potential levels in the unit pixel 200a of FIG. 4 during the reset mode. FIG. 5B is a diagram illustrating potential levels in the unit pixel 200a of FIG. 4 at an initial operation time of the integration mode. FIG. 6 is a diagram illustrating potential levels in the unit pixel 200a of FIG. 4 when the overflowed electrical charges are not generated during the integration mode. FIG. 7 is a diagram illustrating potential levels in the unit pixel 200a of FIG. 4 when the first overflowed electrical charges are generated during the integration mode. FIG. 8 is a diagram illustrating potential levels in the unit pixel 200a of FIG. 4 when the first overflowed electrical charges and the second overflowed electrical charges are generated during the integration mode. In FIGS. 5A, 5B, 6, 7, and 8, a positive direction of Y-axis corresponds to a direction where a potential level becomes lower and an electron has higher energy.

Referring to FIGS. 4 and 5A, in the unit pixel 200a of FIG. 4 according to some example embodiments, the photoelectric conversion region PD may have a potential well capacity of about VPDMAX. During the reset mode, the reset signal RST may be activated, and the potential level of the floating diffusion region FD may be reset by the first voltage level V1 (e.g., a reset voltage level) lower than a level of the power supply voltage VDD. For example, when the reset signal RST is activated to have a logic high level, a potential level of the reset gate RG may become the first voltage level V1, and thus the potential level of a reset state of the floating diffusion region FD may become the first voltage level V1. After the reset operation, electrical charges FDC may remain in the floating diffusion region FD because the floating diffusion region FD is doped with impurities with relatively high doping density. Electrical charges RDC may exist in the reset drain region RD because the power supply voltage VDD is applied to the reset drain region RD.

In some example embodiments, the reset transistor 240 in FIG. 3 may be implemented with an enhancement-type transistor. In this case, the logic high level of the reset signal RST may be substantially the same as the level of the power supply voltage VDD. For example, the enhancement-type transistor may include a p-type semiconductor substrate, a p-well region that is included in the p-type semiconductor substrate, and a source region and a drain region that are included in the p-well region. The p-well region may be doped with higher doping density than the p-type semiconductor substrate.

In other embodiment, the reset transistor 240 in FIG. 3 may be implemented with a depletion-type transistor. In this case, the logic high level of the reset signal RST may be lower than the level of the power supply voltage VDD. For example, the depletion-type transistor may include a p-type semiconductor substrate, and a source region and a drain region that are included in the p-type semiconductor substrate. For another example, the depletion-type transistor may include a p-type semiconductor substrate, a p-well region that is included in the p-type semiconductor substrate, and a source region, a n-channel region and a drain region that are included in the p-well region. The p-well region and the n-channel region may be doped with higher doping density than the p-type semiconductor substrate.

Referring to FIGS. 4 and 5B, in the unit pixel 200a of FIG. 4 according to some example embodiments, the reset signal RST is deactivated and the floating diffusion region FD may have a potential well capacity of about VFDMAX during the integration mode. For example, when the reset signal RST is deactivated to have a logic low level, the potential level of the reset gate RG may become a shut-off voltage level VRGL_SO lower than the potential level of the floating diffusion region FD (e.g., the first voltage level V1). Thus, the floating diffusion region FD may have a potential well and the overflowed electrical charges may be accumulated in the floating diffusion region FD during the integration mode. A magnitude of the VFDMAX may be greater than the magnitude of the VPDMAX.

If a potential level of a floating diffusion region is reset by the level of the power supply voltage VDD or a voltage level higher than the level of the power supply voltage VDD (which is referred to as a hard reset scheme), a shut-off voltage level of a reset gate in each unit pixel may be different from each other due to manufacturing tolerances. Thus, in the hard reset scheme, a difference between the shut-off voltage level of the reset gate and a reset voltage level of the floating diffusion region may be different for each unit pixel. As described above with reference to FIG. 5B, if the potential level of the floating diffusion region FD is reset by the first voltage level V1 lower than the level of the power supply voltage VDD (which is referred to as a soft reset scheme), a difference between the shut-off voltage level VRGL_SO of the reset gate RG and the first voltage level V1 (e.g., a voltage level VRGH_SO) of the floating diffusion region FD may be fixed by a desired (or alternatively, predetermined) value ΔVRG in each unit pixel. In other words, the floating diffusion regions in every unit pixel may have the same potential well capacity of about VFDMAX although the shut-off voltage level VRGL_SO is different for each unit pixel. Thus, the image sensor operated by the method according to some example embodiments may effectively generate an image signal based on the second overflowed electrical charges (e.g., OC2 in FIG. 8), which have overflowed from the photoelectric conversion region PD and are over the potential well capacity VFDMAX of the floating diffusion region FD, without additional compensation operations.

Referring to FIG. 6, if the incident light has relatively low illuminance, e.g., if the illuminance of the incident light is lower than a first reference illuminance, all of the electrical charges generated by the incident light are collected in the photoelectric conversion region PD during the integration mode. The collected electrical charges CC are generated in the photoelectric conversion region PD, and the overflowed electrical charges are not generated. In this case, an image signal generated from the CMOS image sensor 100 may correspond to an amount of the collected electrical charges CC.

Figure 7:
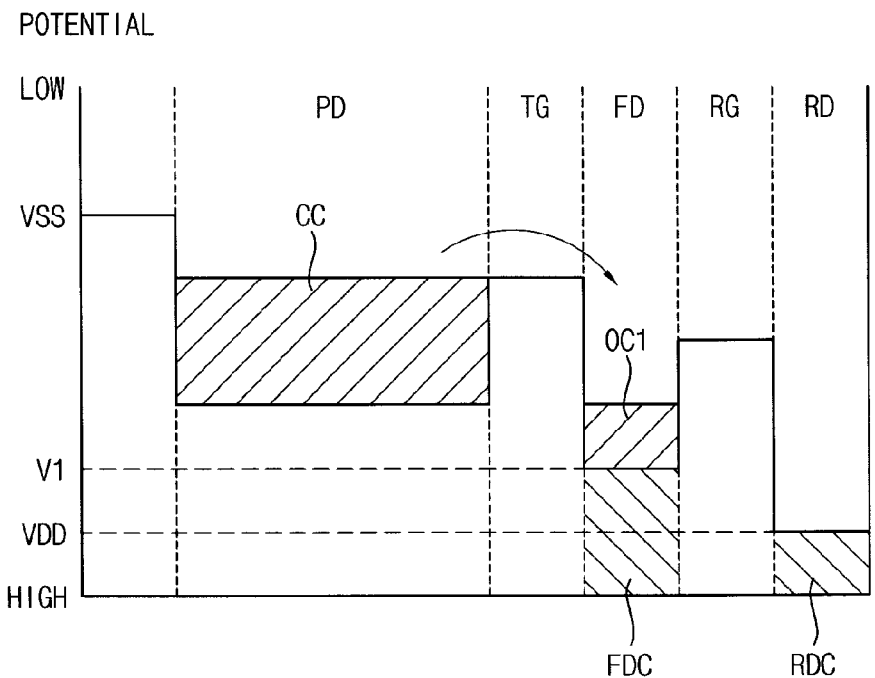

Referring to FIG. 7, if the incident light has relatively high illuminance, e.g., if the illuminance of the incident light is higher than the first reference illuminance and is lower than a second reference illuminance, the electrical charges generated by the incident light are collected in the photoelectric conversion region PD in an initial operation time of the integration mode. When the number of the electrical charges generated by the incident light is larger than the number of electrical charges corresponding to the potential well capacity (e.g., VPDMAX) of the photoelectric conversion region PD, some electrical charges are overflowed from the photoelectric conversion region PD. That is, the collected electrical charges CC are generated in the photoelectric conversion region PD and the first overflowed electrical charges OC1 are also generated. The second reference illuminance may be higher than the first reference illuminance.

The first overflowed electrical charges OC1 are within the potential well capacity (e.g., VFDMAX) of the floating diffusion region FD, and are accumulated in the floating diffusion region FD during the integration mode. In this case, an image signal generated from the CMOS image sensor 100 may correspond to a sum of an amount of the collected electrical charges CC and an amount of the first overflowed electrical charges OC1.

Figure 8:
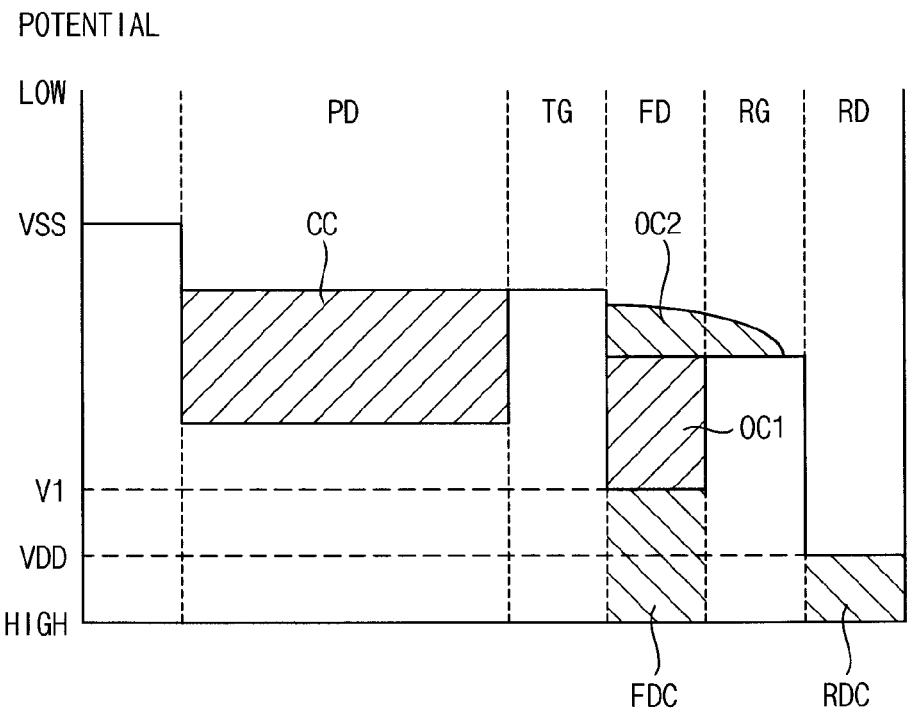

Referring to FIG. 8, if the incident light has very high illuminance, e.g., if the illuminance of the incident light is higher than the second reference illuminance, the electrical charges generated by the incident light are collected in the photoelectric conversion region PD in an initial operation time of the integration mode. When the number of the electrical charges generated by the incident light is larger than a sum of the number of electrical charges corresponding to the potential well capacity (e.g., VPDMAX) of the photoelectric conversion region PD and the number of electrical charges corresponding to the potential well capacity (e.g., VFDMAX) of the floating diffusion region FD, some electrical charges are overflowed from the floating diffusion region FD, but some electron charges remain on the floating diffusion region FD as illustrated in FIG. 8. That is, the collected electrical charges CC are generated in the photoelectric conversion region PD, and the first overflowed electrical charges OC1 and the second overflowed electrical charges OC2 are also generated.

The second overflowed electrical charges OC2 are over the potential well capacity (e.g., VFDMAX) of the floating diffusion region FD, and are accumulated on the floating diffusion region FD during the integration mode. In this case, an image signal generated from the CMOS image sensor 100 may correspond to a sum of a quantity of the collected electrical charges CC, a quantity of the first overflowed electrical charges OC1 and a quantity of the second overflowed electrical charges OC2.

Figure 9:
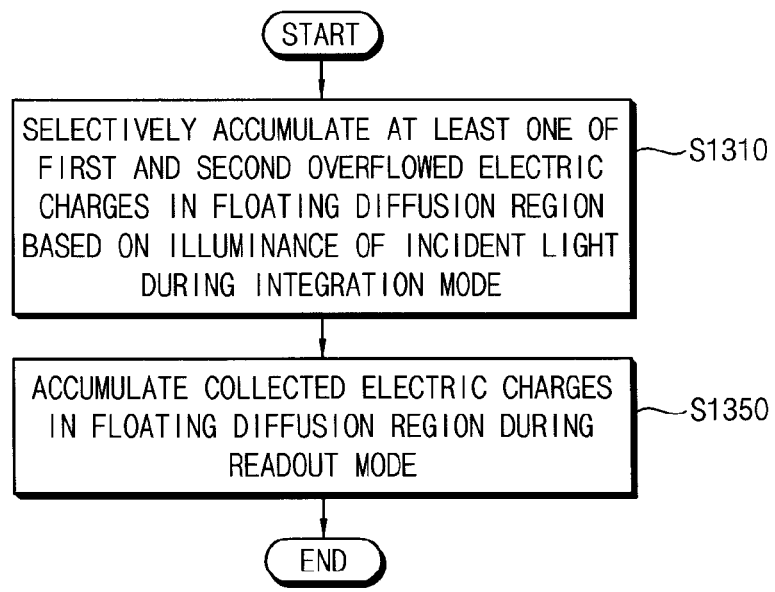
FIG. 9 is a flow chart illustrating an example of step S1300 in FIG. 1.

FIG. 9 is a flow chart illustrating an example of step S1300 in FIG. 1.

Referring to FIG. 9, in the step S1300, at least one of the first overflowed electrical charges and the second overflowed electrical charges may be selectively accumulated in the floating diffusion region based on the illuminance of the incident light during the integration mode (step S1310). The collected electrical charges may be accumulated in the floating diffusion region during the readout mode after the integration mode (step S1350).

Figure 10:
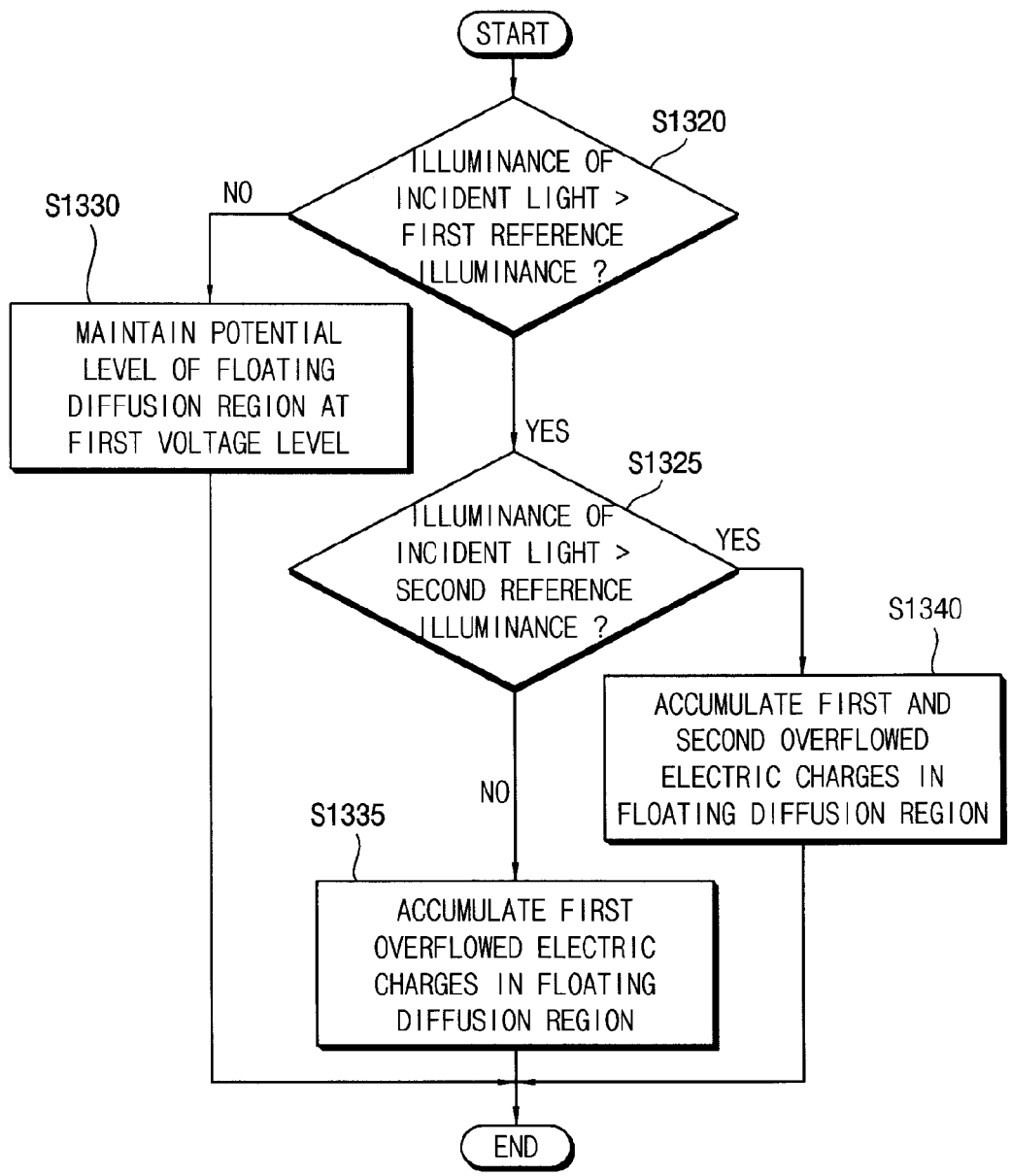
FIG. 10 is a flow chart illustrating an example of step S1310 in FIG. 9.

FIG. 10 is a flow chart illustrating an example of step S1310 in FIG. 9.

Referring to FIG. 10, in the step S1310, it may be determined whether the illuminance of the incident light is higher than the first reference illuminance (step S1320), and it may be determined whether the illuminance of the incident light is higher than the second reference illuminance (step S1325). When the illuminance of the incident light is lower than the first reference illuminance (step S1320: NO), the potential level of the floating diffusion region may be maintained at the first voltage level (step S1330), as illustrated in FIG. 6. When the illuminance of the incident light is higher than the first reference illuminance and is lower than the second reference illuminance (step S1320: YES and step S1325: NO), the first overflowed electrical charges may be accumulated in the floating diffusion region (step S1335), as illustrated in FIG. 7. When the illuminance of the incident light is higher than the second reference illuminance (step S1320: YES and step S1325: YES), the first overflowed electrical charges may be accumulated in the floating diffusion region and the second overflowed electrical charges may be accumulated on the floating diffusion region (step S1340), as illustrated in FIG. 8.

In some example embodiments, the first and second reference illuminances may have different values depending on a size of the photoelectric conversion region, the doping density of the photoelectric conversion region, the time duration of the integration mode, etc.

Figure 11:
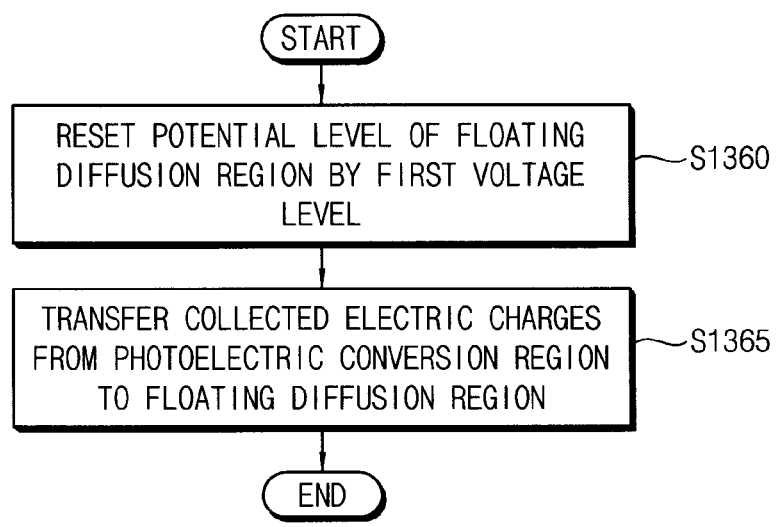
FIG. 11 is a flow chart illustrating an example of step S1350 in FIG. 9.

FIG. 11 is a flow chart illustrating an example of step S1350 in FIG. 9.

Referring to FIG. 11, in the step S1350, the potential level of the floating diffusion region may be reset by the first voltage level during a first period of the readout mode (step S1360). The collected electrical charges may be accumulated in the floating diffusion region during a second period of the readout mode (step S1365).

Figure 12:
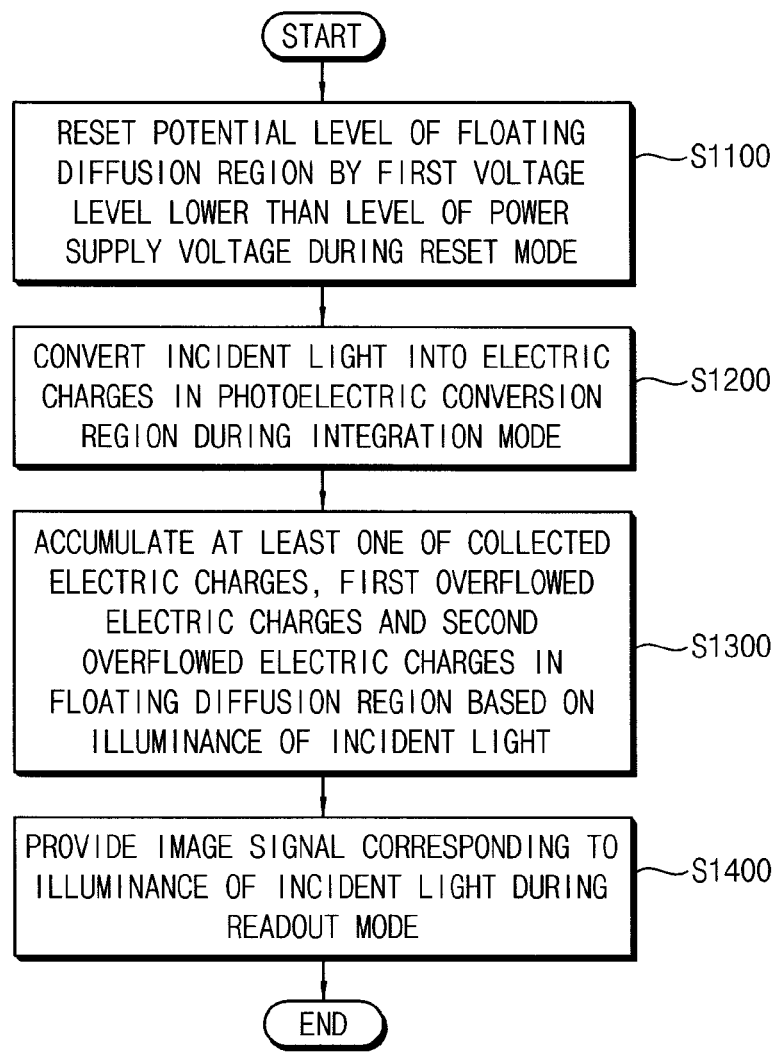
FIG. 12 is a flow chart illustrating a method of driving an image sensor according to some example embodiments.

FIG. 12 is a flow chart illustrating a method of driving an image sensor according to some example embodiments.

Referring to FIG. 12, in the method of driving the image sensor according to some example embodiments, a potential level of the floating diffusion region is reset by a first voltage level during a reset mode before a integration mode (step S1100). The first voltage level is lower than a level of a power supply voltage. Incident light is converted into electrical charges in the photoelectric conversion region during the integration mode (step S1200). At least one of collected electrical charges, first overflowed electrical charges, and second overflowed electrical charges is accumulated in the floating diffusion region based on illuminance of the incident light (step S1300). The collected electrical charges indicate electrical charges that are collected in the photoelectric conversion region. The first overflowed electrical charges indicate electrical charges that have overflowed from the photoelectric conversion region and are within potential well capacity of the floating diffusion region. The second overflowed electrical charges indicate electrical charges that have overflowed from the photoelectric conversion region and are over the potential well capacity of the floating diffusion region. An image signal corresponding to the illuminance of the incident light is provided based on at least one of the collected electrical charges, the first overflowed electrical charges and the second overflowed electrical charges during a readout mode after the integration mode (step S1400). The step S1100, S1200 and S1300 in FIG. 12 may be substantially the same as the step S1100, S1200 and S1300 in FIG. 1, respectively.

Figure 13:
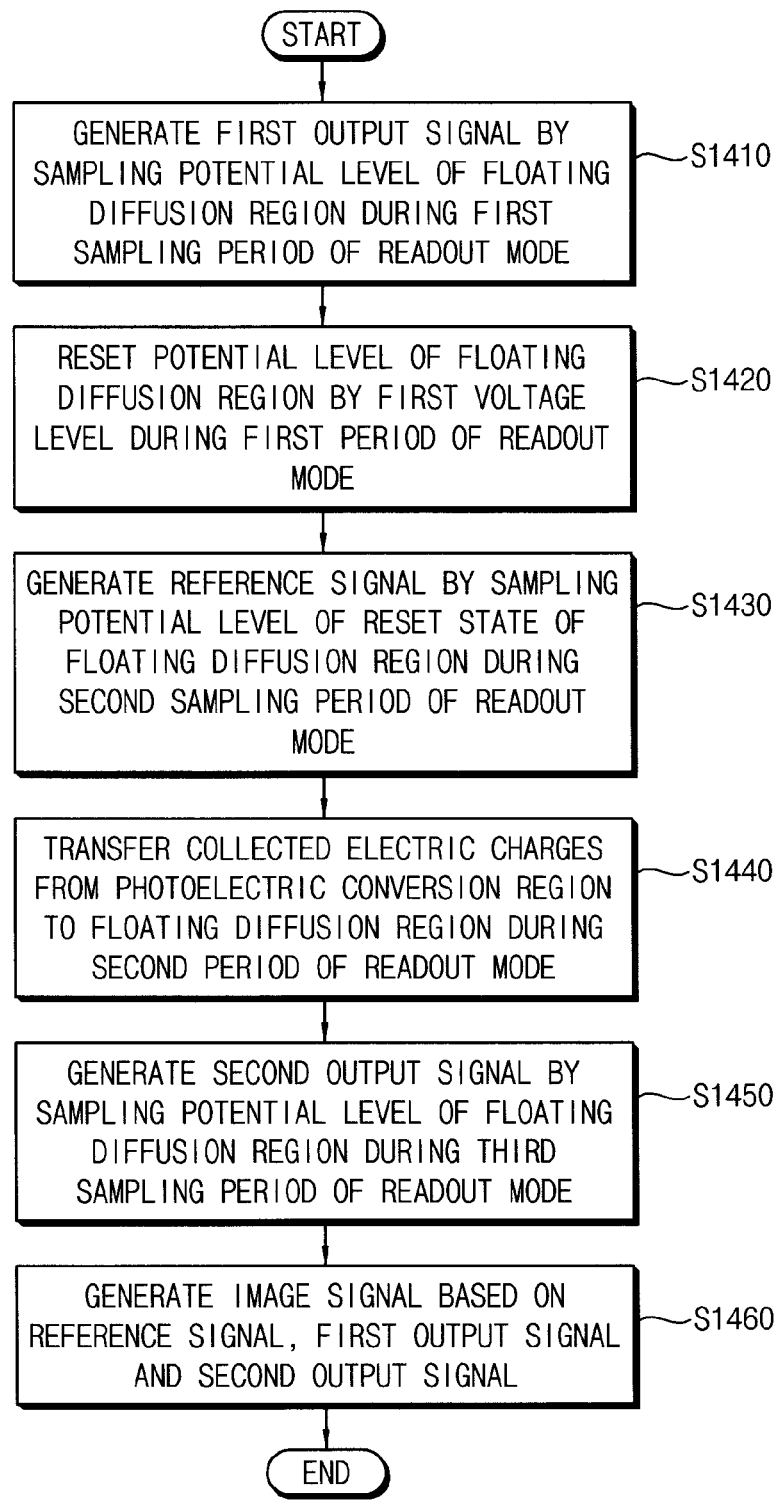
FIG. 13 is a flow chart illustrating an example of step S1400 in FIG. 12.

FIG. 13 is a flow chart illustrating an example of step S1400 in FIG. 12.

Referring to FIG. 13, in the step S1400, a first output signal may be generated by sampling the potential level of the floating diffusion region during a first sampling period of the readout mode (step S1410). The potential level of the floating diffusion region may be reset by the first voltage level during a first period of the readout mode (step S1420). A reference signal may be generated by sampling the potential level of the reset state of the floating diffusion region during a second sampling period of the readout mode (step S1430). The collected electrical charges may be transferred from the photoelectric conversion region to the floating diffusion region during a second period of the readout mode (step S1440). A second output signal may be generated by sampling the potential level of the floating diffusion region during a third sampling period of the readout mode (step S1450). The image signal may be generated based on the reference signal, the first output signal and the second output signal (step S1460).

In some example embodiments, the first output signal may correspond to one of the overflowed electrical charges and the potential level of the reset state of the floating diffusion region. For example, the first output signal may correspond to the potential level of the reset state of the floating diffusion region when the illuminance of the incident light is lower than the first reference illuminance. The first output signal may correspond to the first overflowed electrical charges (e.g., the amount of the first overflowed electrical charges) when the illuminance of the incident light is higher than the first reference illuminance and is lower than the second reference illuminance. The first output signal may correspond to the first overflowed electrical charges and the second overflowed electrical charges (e.g., the sum of the amount of the first overflowed electrical charges and the amount of the second overflowed electrical charges) when the illuminance of the incident light is higher than the second reference illuminance. The second output signal may correspond to the collected electrical charges (e.g., an amount of the collected electrical charges).

In some example embodiments, as described above with reference to FIG. 4, the unit pixel 200a may include the reset gate 240a that resets the floating diffusion region 230a in response to the reset signal RST and the transfer gate 220a that transfers the collected electrical charges to the floating diffusion region 230a in response to the transfer signal TX. The reset signal RST may be activated during the first period of the readout mode, and the transfer signal TX may be activated during the second period of the readout mode. The reset signal RST and the transfer signal TX may be deactivated during the first sampling period of the readout mode, the second sampling period of the readout mode and the third sampling period of the readout mode.

Figure 14:
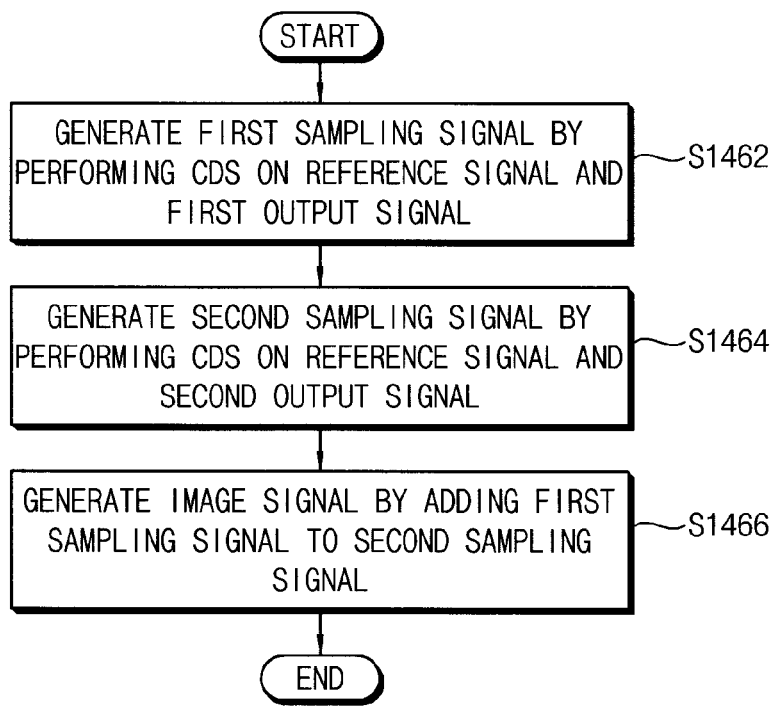
FIG. 14 is a flow chart illustrating an example of step S1460 in FIG. 13.

FIG. 14 is a flow chart illustrating an example of step S1460 in FIG. 13.

Referring to FIG. 14, in the step S1460, a first sampling signal may be generated by performing correlated double sampling on the reference signal and the first output signal (step S1462). A second sampling signal may be generated by performing the correlated double sampling on the reference signal and the second output signal (step S1464). The image signal may be generated by adding the first sampling signal to the second sampling signal (step S1466).

The method of driving the image sensor according to some example embodiments may be applied to a front-side illumination CMOS image sensor (FIS) and a back-side illumination CMOS image sensor (BIS). In addition, the method of driving the image sensor according to some example embodiments may be applied to image sensors of a global shutter type or a rolling shutter type. For example, when a still image is captured in an image sensor of the global shutter type, a shutter may be open for all rows of pixels during the integration mode, and the read voltage may be applied to the transfer gates of each row in row-by-row order during the readout mode. In an image sensor of the rolling shutter type, operations of the integration mode and the readout mode are repeated for each row.

Figure 15:
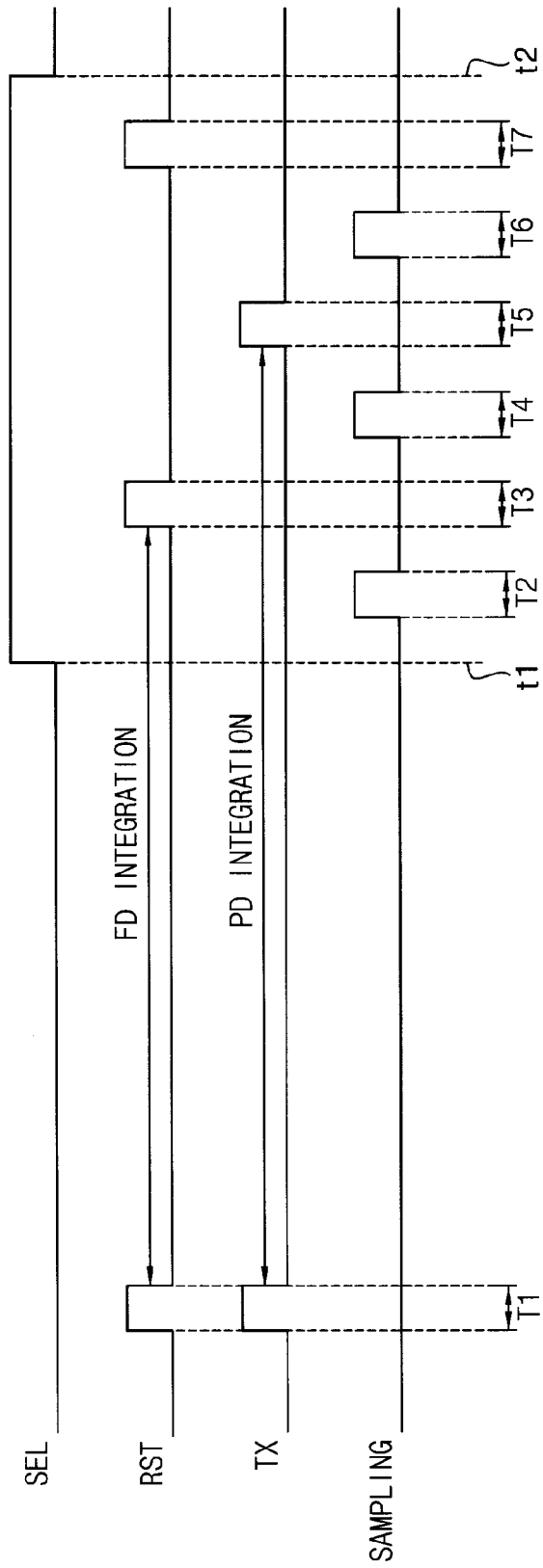
FIG. 15 is a timing diagram for describing the method of driving the image sensor according to some example embodiments.

FIG. 15 is a timing diagram for describing the method of driving the image sensor according to some example embodiments.

Hereinafter, the method of driving the image sensor according to some example embodiments will be described with reference to FIGS. 1 through 15.

The CMOS image sensor 100 of FIG. 2 operated by the method of driving the image sensor according to some example embodiments includes a plurality of unit pixels arranged in a matrix form. Each unit pixel includes the photoelectric conversion region 210a, the transfer gate 220a, the floating diffusion region 230a and the reset gate 240a, as illustrated in FIG. 4. During the reset mode, the floating diffusion region 230a is reset. During the integration mode, image information on an object to be captured is obtained by collecting charge carriers in the photoelectric conversion region 210a. During the readout mode, the image information in a form of charge carriers is converted into electrical signals.

During a time period T1 (e.g., during the reset mode before the integration mode), the transfer signal TX and the reset signal RST are activated to reset the photoelectric conversion region 210a and the floating diffusion region 230a. The floating diffusion region 230a is reset by the first voltage level V1 lower than the level of the power supply voltage VDD. As described above with reference to FIGS. 3 and 5A, the logic high level of the transfer signal TX may be higher than or substantially the same as the level of the power supply voltage VDD. The logic high level of the reset signal RST may be lower than or substantially the same as the level of the power supply voltage VDD depending on the type of the reset transistor 240.

After the time period T1, the transfer signal TX and the reset signal RST are deactivated, the shutter of the CMOS image sensor 100 is opened, and the CMOS image sensor 100 starts to operate in the integration mode. During the integration mode, the incident light is converted into electrical charges in the photoelectric conversion region 210a. The reset signal RST is deactivated during the entire integration mode to allow the first and/or second overflowed electrical charges to be accumulated in the floating diffusion region 230a.

At time t1, the select signal SEL is activated and the unit pixel for providing the image signal is selected. The CMOS image sensor 100 starts to operate in the readout mode. As described above with reference to FIG. 3, the logic high level of the select signal SEL may be higher than or substantially the same as the level of the power supply voltage VDD. During the first sampling period (e.g., a time period T2) of the readout mode, the first output signal is generated by sampling the potential level of the floating diffusion region 230a. When the first and second overflowed electrical charges are not accumulated in the floating diffusion region 230a during the integration period, the first output signal may correspond to the potential level of the reset state of the floating diffusion region 230a. When the first overflowed electrical charges are accumulated in the floating diffusion region 230a during the integration period, the first output signal may correspond to the amount of the first overflowed electrical charges. When the first and second overflowed electrical charges are accumulated in the floating diffusion region 230a during the integration period, the first output signal may correspond to the sum of the amount of the first overflowed electrical charges and the amount of the second overflowed electrical charges.

During the first period (e.g., a time period T3) of the readout mode, the reset signal RST is activated and the floating diffusion region 230a is reset. When at least one of the first and second overflowed electrical charges are accumulated in the floating diffusion region 230a during the integration mode, the overflowed electrical charges may be discharged and the floating diffusion region 230a becomes the reset state (e.g. has the first voltage level V1). When the first and second overflowed electrical charges are not accumulated in the floating diffusion region 230a during the integration mode, the reset state of the floating diffusion region 230a is maintained. During the second sampling period (e.g., a time period T4) of the readout mode, the reference signal is generated by sampling the potential level of the reset state of the floating diffusion region 230a. The reference signal may be used for performing the CDS operation.

During the second period (e.g., a time period T5) of the readout mode, the transfer signal TX is activated and the collected electrical charges are transferred from the photoelectric conversion region 210a to the floating diffusion region 230a. The collected electrical charges are accumulated in the floating diffusion region 230a. During the third sampling period (e.g., a time period T6) of the readout mode, the second output signal is generated by sampling the potential level of the floating diffusion region 230a. The second output signal may correspond to the amount of the collected electrical charges.

During a time period T7, the reset signal RST is activated, the collected electrical charges are discharged, and the floating diffusion region 230a is reset. At time t2, the select signal SEL is deactivated, and thus the readout mode is over.

In some example embodiments, the signal processing unit 120 generates the image signal based on the reference signal, the first output signal and the second output signal during the readout mode.

The CDS unit 122 performs the CDS operation on the reference signal and the first output signal to generate the first sampling signal, and performs the CDS operation on the reference signal and the second output signal to generate the second sampling signal. For example, the CDS unit 122 may generate the first sampling signal by subtracting the reference signal from the first sampling signal, and may generate the second sampling signal by subtracting the reference signal from the second sampling signal.

In the operation of generating the second sampling signal, the floating diffusion region 230a is reset and the reference signal is generated based on a current reset state. After the reference signal is generated, the collected electrical charges are transferred from the photoelectric conversion region 210a to the floating diffusion region 230a, and then the second output signal is generated based on the current reset state. Thus, the second sampling signal may be generated based on a true CDS operation because both of the reference signal and the second output signal are generated based on the current reset state.

In the operation of generating the first sampling signal, the overflowed electrical charges are transferred from the photoelectric conversion region 210a to the floating diffusion region 230a, and the first output signal is generated based on a previous reset state. After the first output signal is generated, the floating diffusion region 230a is reset and the reference signal is generated based on the current reset state. Thus, the first sampling signal may be generated based on a non-true CDS operation because the first output signal is generated based on the previous reset state and the reference signal is generated based on the current reset state. The first sampling signal may include a noise signal due to the non-true CDS operation. However, a level of the noise signal may be much lower than a level of the first sampling signal, and thus an influence of the noise signal may be neglected.

The ADC unit 123 adds the first sampling signal to the second sampling signal and converts the added signal into a digital signal to provide the image signal. The buffer unit 127 included in the ADC unit 123 may store the first sampling signal before until the second sampling signal is generated. The buffer unit 127 may be implemented with a plurality of single line buffers because a time interval between a time point at which the first sampling signal is generated (e.g., after the time period T4) and a time point at which the second sampling signal is generated (e.g., after the time period T6) is relatively short.

In some example embodiments, the timing controller 129 included in the CMOS image sensor 100 may control a start time point of the reset mode, e.g., an activation time point of the reset signal RST. In addition or in the alternative, the timing controller 129 may control the duration of the reset mode and/or the end time point of the reset mode. The dynamic range of the CMOS image sensor 100 may be controlled by changing the start time point of the reset mode because the dynamic range of the CMOS image sensor 100 is determined based on a ratio of a time duration of the FD integration to a time duration of the PD integration. For example, when the reset signal RST is activated later than an example embodiment illustrated in FIG. 15, the time duration of the FD integration may be shorter than the example embodiment illustrated in FIG. 15. As the start time point of the reset mode is delayed, that is, as the time duration of the FD integration is shorter, the dynamic range of the CMOS image sensor may increase. In the example embodiment illustrated in FIG. 15, the reset signal RST and the transfer signal TX are simultaneously activated, and thus a ghost image and a flicker may be prevented.

In the method of driving the image sensor according to some example embodiments, timings of the signals are controlled in the integration mode and the readout mode, and the overflowed electrical charges and the collected electrical charges are sequentially accumulated in the floating diffusion region 230a depending on the illuminance of the incident light. The first output signal is generated based on at least one of the first and second overflowed electrical charges, the second output signal is generated based on the collected electrical charges, and the image signal is generated based on the first and second output signals. Thus, the image sensor operated by the method according to some example embodiments may have a wide dynamic range and improved performances.

Figure 16:
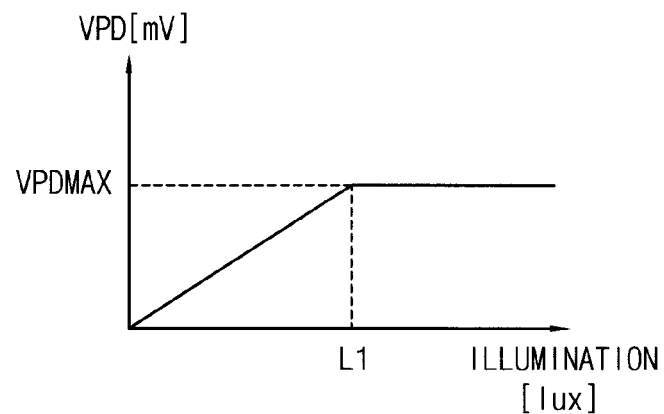
FIGS. 16, 17, and 18 are diagrams for describing the method of driving the image sensor according to some example embodiments.
Figure 17:
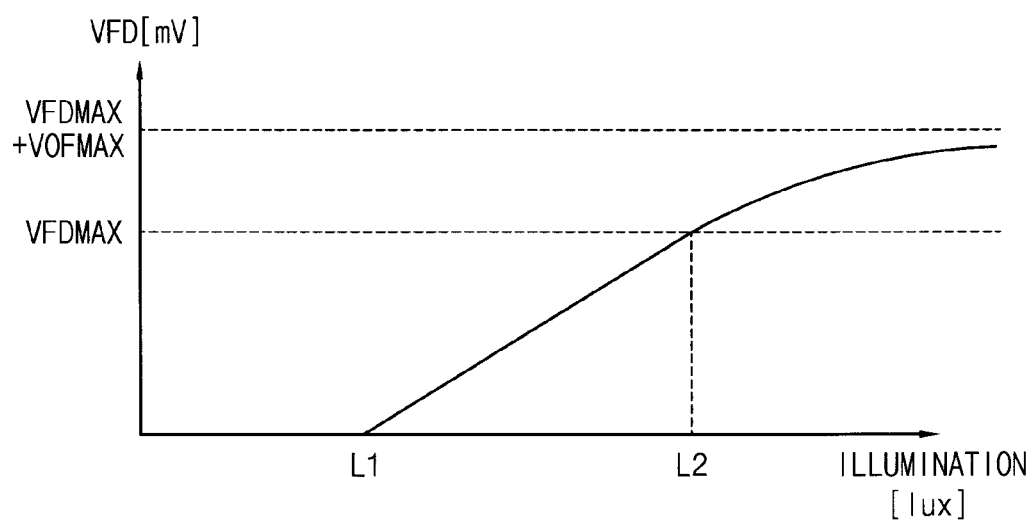
Figure 18:
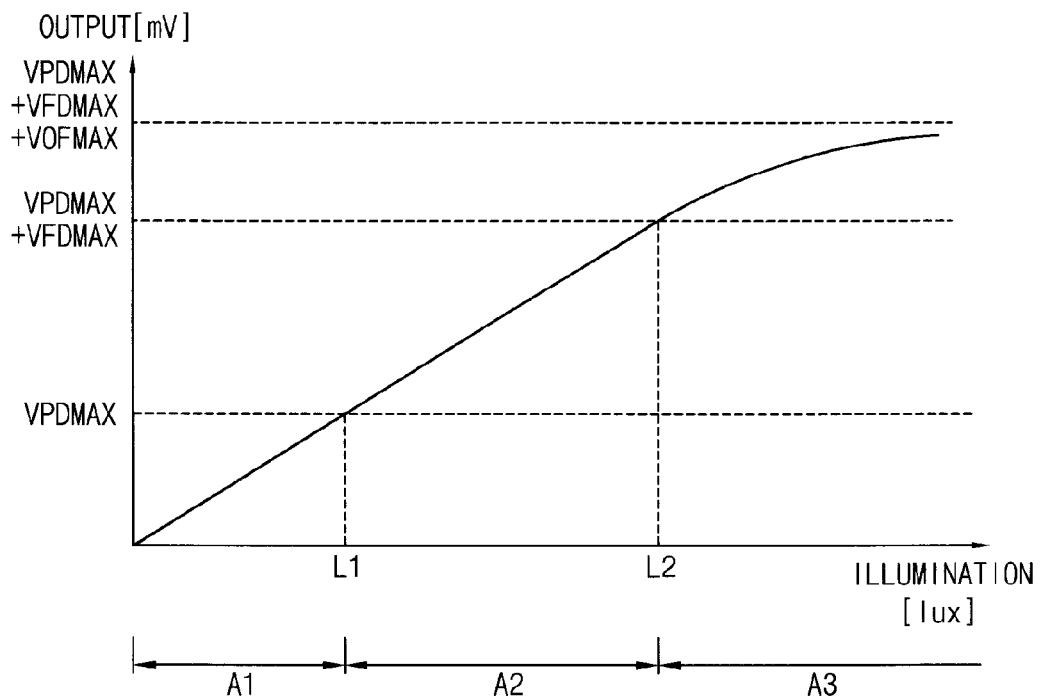

FIGS. 16, 17, and 18 are diagrams for describing the method of driving the image sensor according to some example embodiments.

FIG. 16 illustrates a variation of a voltage level of the photoelectric conversion region 210a during the integration mode, according to the illuminance of the incident light. FIG. 17 illustrates a variation of a voltage level of the floating diffusion region 230a during the integration mode, according to the illuminance of the incident light. FIG. 18 illustrates a voltage level of the output image signal of the image sensor, according to the illuminance of the incident light.

Referring to FIG. 16, as the illuminance of the incident light increases, the number of electrical charges that are generated and collected in the photoelectric conversion region 210a increases, and thus the voltage level of the photoelectric conversion region 210a linearly increases (e.g., a linear response). When the illuminance of the incident light corresponds to a first reference illuminance L1, the voltage level of the photoelectric conversion region 210a corresponds to a maximum level VPDMAX. Although the illuminance of the incident light is higher than the first reference illuminance L1, the voltage level of the photoelectric conversion region 210a maintains the maximum level VPDMAX because the potential well capacity of the photoelectric conversion region 210a is fixed. The overflowed electrical charges, which are not collected in the photoelectric conversion region 210a, are generated and move toward the floating diffusion region 230a.

Referring to FIG. 17, when the illuminance of the incident light is higher than the first reference illuminance L1 and is lower than a second reference illuminance L2, the first overflowed electrical charges are accumulated in the floating diffusion region 230a, and thus the voltage level of the floating diffusion region 230a linearly increases (e.g., the linear response). When the illuminance of the incident light is higher than the second reference illuminance L2, the first and second overflowed electrical charges are accumulated in the floating diffusion region 230a, and the voltage level of the floating diffusion region 230a logarithmically increases (e.g., the logarithmic response) because the second overflowed electrical charges are over the potential well capacity of the floating diffusion region 230a. In other words, the voltage level of the floating diffusion region 230a linearly increases until the voltage level of the floating diffusion region 230a reaches a first level VFDMAX, and the voltage level of the floating diffusion region 230a logarithmically increases from the first level VFDMAX to a maximum level (VFDMAX+VOFMAX).

Referring to FIG. 18, the voltage level of the output image signal is calculated by adding the voltage level of the photoelectric conversion region 210a (illustrated in FIG. 16) to the voltage level of the floating diffusion region 230a (illustrated in FIG. 17). The CMOS image sensor operated by the method according to some example embodiments has a dynamic range corresponding to areas A1, A2, and A3, while the conventional CMOS image sensor has a dynamic range corresponding to the area A1. Thus, the CMOS image sensor operated by the method according to some example embodiments may have a wide dynamic range. For example, the CMOS image sensor operated by the method according to some example embodiments may have a wide dynamic range of about 120 dB. In addition, since the output image signal is calculated by adding the voltage level of the photoelectric conversion region 210a to the voltage level of the floating diffusion region 230a, a signal-to-noise ratio (SNR) dip phenomenon, which indicates the SNR curve of the output image signal having discontinuous values at the reference illuminances L1 and L2, may be prevented, and thus the CMOS image sensor operated by the method according to some example embodiments may have improved performance.

In some example embodiments, in the method of driving the image sensor according to some example embodiments, the image signal may be further processed by dividing responses of the image sensor into a linear response and a logarithmic response according to a level of the image signal. For example, when the level of the image signal is lower than a reference level corresponding to the second reference illuminance L2, the image signal may be processed based on the linear response. When the level of the image signal is higher than the reference level, the image signal may be processed based on the linear response and the logarithmic response.

As illustrated in FIG. 18, the image signal that is output from the image sensor has a response characteristic in which the linear response and the logarithmic response are combined. The image signal has the linear response characteristic when the illuminance of the incident light is lower than the second reference illuminance L2, and the image signal has the logarithmic response characteristic when the illuminance of the incident light is higher than the second reference illuminance L2. Thus, the response of the image sensor may be divided into the linear response and the logarithmic response according to whether the level of the image signal exceeds the reference level corresponding to the second reference illuminance L2, a signal corresponding to the illuminance of the incident light may be recovered by processing the image signal according to an algorithm corresponding to each response.

In some example embodiments, a slope of the variation of the voltage level of the floating diffusion region 230a (e.g., a slope of the area A2) may be controlled by changing the start time point of the reset mode. For example, as the start time point of the reset mode is delayed, that is, as the time duration of the FD integration is short, the slope of the variation of the voltage level of the floating diffusion region 230a may decrease, as described above with reference to FIG. 15. Thus, the dynamic range of the CMOS image sensor operated by the method according to some example embodiments may be effectively controlled.

In FIGS. 16, 17, and 18, although Y-axis corresponds to an analog voltage level, the Y-axis may correspond to the number of generated electrical charge (i.e., the quantity of the electrical charge), the charge storage capacity and a digital voltage level, etc.

Figure 19:
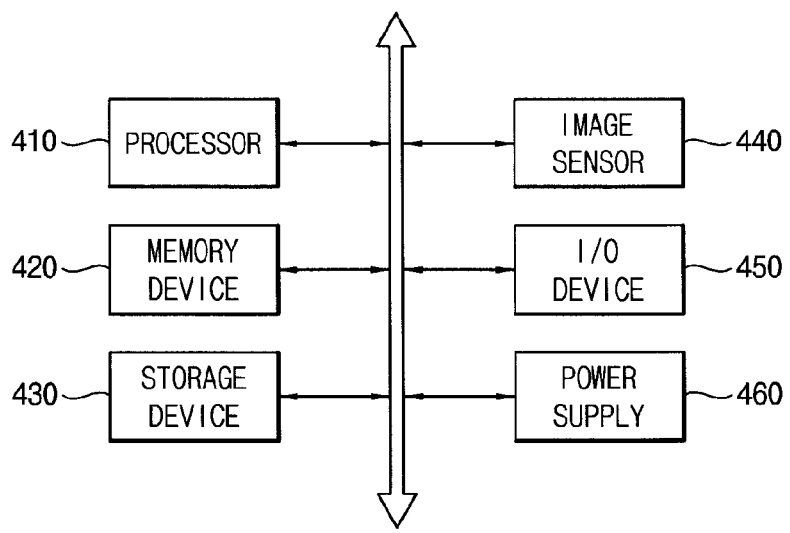
FIG. 19 is a diagram illustrating a computing system according to some example embodiments.

FIG. 19 is a diagram illustrating a computing system according to some example embodiments.

Referring to FIG. 19, a computing system 400 includes a processor 410, a memory device 420, a storage device 430, an input/output (I/O) device 450, a power supply 460 and an image sensor 440. Although not illustrated in FIG. 19, the computing system 400 may further include a plurality of ports for communicating a video card, a sound card, a memory card, a universal serial bus (USB) device and/or other electrical devices.

The processor 410 may perform various computing functions. The processor 410 may be a microprocessor and/or a central processing unit (CPU). The processor 410 may be connected to the memory device 420, the storage device 430, and the I/O device 450 via a bus, e.g., an address bus, a control bus, and/or a data bus. The processor 410 may be connected to an extended bus, e.g., a peripheral component interconnection (PCI) bus.

The memory device 420 may store data for operations of the computing system 400. For example, the memory device 420 may include a dynamic random access memory (DRAM) device, a SRAM device, an erasable programmable read-only memory (EPROM) device, an electrically erasable programming read-only memory (EEPROM) device and/or a flash memory device.

The storage device 430 may include a solid state drive device, a hard disk drive device and/or a CD-ROM device. The I/O device 450 may include input devices, e.g., a keyboard, a keypad and/or a mouse, and output devices, e.g., a printer and/or a display device. The power supply 460 may provide a power for operations of the computing system 400.

The image sensor 440 may communicate with the processor 410 via the bus or other communication links. The image sensor 440 may be the CMOS image sensor 100 of FIG. 2 that includes one of the unit pixel 200 of FIG. 3 and the unit pixel 200a of FIG. 4. The image sensor 440 may be operated by the method of FIG. 1 or the method of FIG. 12. The image sensor 440 resets a potential level of a floating diffusion region by a first voltage level lower than a power supply voltage during a reset mode, converts an incident light into electrical charges in photoelectric conversion regions during an integration mode, and accumulates at least one of collected electrical charges, first overflowed electrical charges and second overflowed electrical charges in the floating diffusion regions based on illuminance of the incident light. The image sensor 440 may provide an image signal corresponding to the illuminance of the incident light during a readout mode after the integration mode. Thus, the image sensor 440 may have relatively wide dynamic range and improved performance.

According to some example embodiments, the computing system 400 and/or components of the computing system 400 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi-chip package (MCP), wafer-level fabricated package (WFP), or wafer-level processed stack package (WSP).

In some example embodiments, the image sensor 440 and the processor 410 may be fabricated as one integrated circuit chip. In some example embodiments, the image sensor 440 and the processor 410 may be fabricated as two separate integrated circuit chips.

Figure 20:
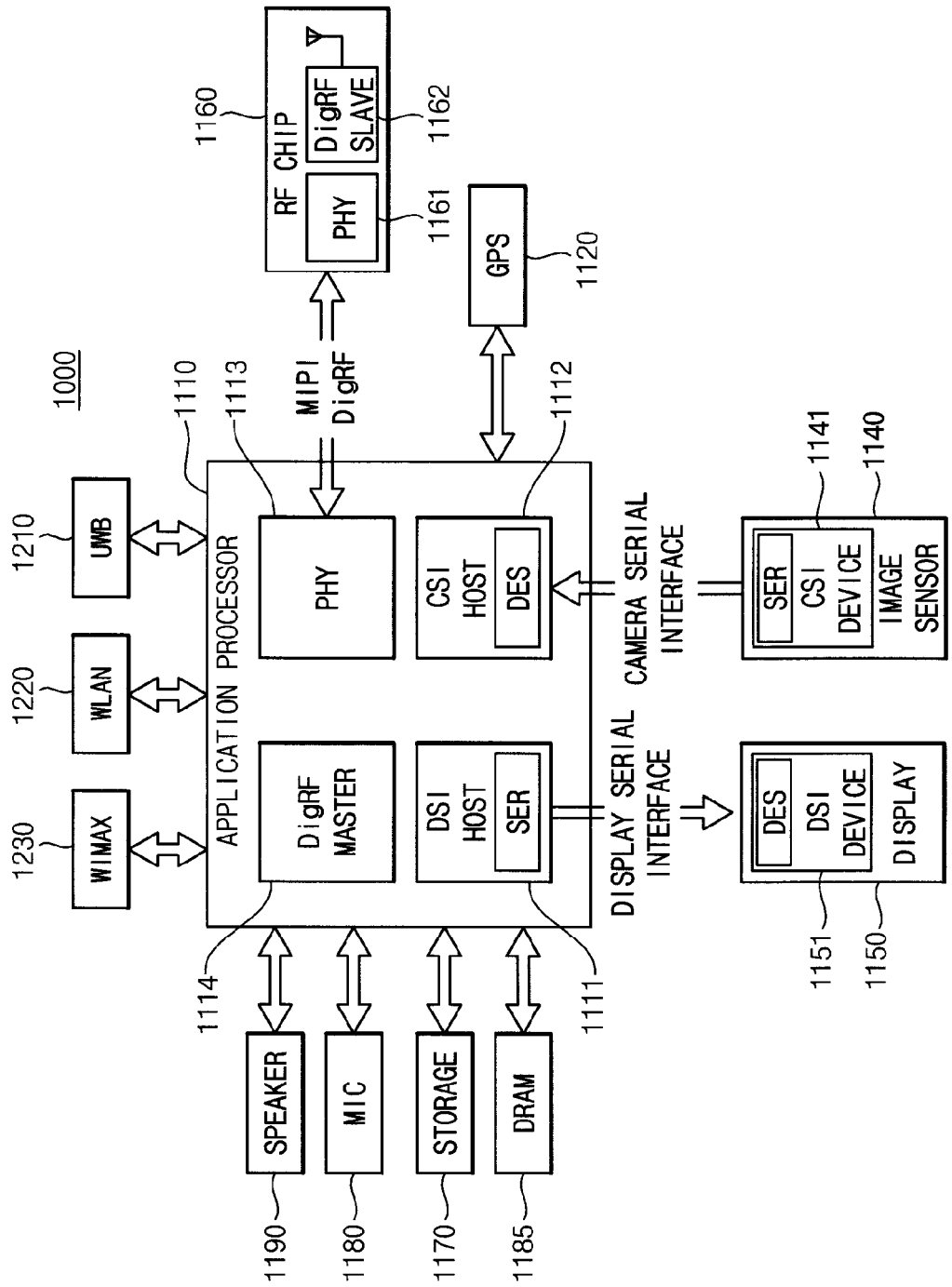
FIG. 20 is a block diagram illustrating an example of an interface used for the computing system of FIG. 19.

FIG. 20 is a block diagram illustrating an example of an interface used for the computing system of FIG. 19.

Referring to FIG. 20, the computing system 1000 may be implemented by a data processing device that uses, or supports a mobile industry processor interface (MIPI) interface (e.g., a mobile phone, a personal digital assistant (PDA), a portable multimedia player (PMP), and/or a smart phone). The computing system 1000 may include an application processor 1110, an image sensor 1140 and/or a display device 1150.

A CSI host 1112 of the application processor 1110 may perform a serial communication with a CSI device 1141 of the image sensor 1140 using a camera serial interface (CSI). In some example embodiments, the CSI host 1112 may include a light deserializer (DES), and the CSI device 1141 may include a light serializer (SER). A DSI host 1111 of the application processor 1110 may perform a serial communication with a DSI device 1151 of the display device 1150 using a display serial interface (DSI). In some example embodiments, the DSI host 1111 may include a light SER, and the DSI device 1151 may include a light DES.

The computing system 1000 may further include a radio frequency (RF) chip 1160. The RF chip 1160 may perform a communication with the application processor 1110. A physical layer (PHY) 1113 of the computing system 1000 and a PHY 1161 of the RF chip 1160 may perform data communications based on a MIPI digital RF (DigRF). The application processor 1110 may further include a DigRF MASTER 1114 that controls the data communications of the PHY 1161.

The computing system 1000 may include a global positioning system (GPS) 1120, a storage 1170, a microphone (MIC) 1180, a DRAM device 1185, and a speaker 1190. In addition, the computing system 1000 may perform communications using an ultra wideband (UWB) 1210, a wireless local area network (WLAN) 1220 and/or a worldwide interoperability for microwave access (WIMAX) 1230. However, the structure and the interface of the computing system 1000 are not limited thereto.

The above described embodiments may be applied to an image sensor, and an electronic system having the image sensor. For example, the electronic system may be a system using an image sensor, e.g., a computer, a digital camera, a 3-D camera, a cellular phone, a PDA, a scanner, a navigation system, a video phone, a surveillance system, an auto-focusing system, a tracking system, a motion-sensing system and/or an image-stabilization system.

While example embodiments have been particularly shown and described, it will be understood by those of ordinary skill in the art that various changes in form and details may be made therein without departing from the spirit and scope of the present invention as defined by the following claims.

What is claimed is:

1. A method of driving an image sensor including a plurality of unit pixels, each unit pixel having a photoelectric conversion region and a floating diffusion region, the method comprising:

resetting a potential level of the floating diffusion region by a first voltage level during a reset mode, the first voltage level being lower than a level of a power supply voltage;
converting incident light into electrical charges in the photoelectric conversion region during an integration mode;
accumulating at least one of collected electrical charges, first overflowed electrical charges, and second overflowed electrical charges in the floating diffusion region based on illuminance of the incident light, the collected electrical charges indicating electrical charges that are collected in the photoelectric conversion region, the first overflowed electrical charges indicating electrical charges that have overflowed from the photoelectric conversion region and are within potential well capacity of the floating diffusion region, and the second overflowed electrical charges indicating electrical charges that have overflowed from the photoelectric conversion region and are over the potential well capacity of the floating diffusion region; and
providing an image signal corresponding to the illuminance of the incident light based on at least one of the collected electrical charges, the first overflowed electrical charges, and the second overflowed electrical charges during a readout mode after the integration mode;
wherein providing the image signal includes:
generating a first output signal by sampling the potential level of the floating diffusion region during a first sampling period of the readout mode;
generating a reference signal by sampling the potential level of a reset state of the floating diffusion region during a second sampling period of the readout mode;
generating a second output signal by sampling the potential level of the floating diffusion region during a third sampling period of the readout mode; and
generating the image signal based on the reference signal, the first output signal, and the second output signal.

2. The method of claim 1, wherein each unit pixel further includes a reset gate that resets the floating diffusion region in response to a reset signal,
wherein a difference between the first voltage level and a shut-off voltage level of the reset gate is fixed by a value in each unit pixel, and
wherein the shut-off voltage level indicates a potential level of the reset gate when the reset signal corresponds to a logic low level.

3. The method of claim 1, wherein accumulating at least one of the collected electrical charges, the first overflowed electrical charges, and the second overflowed electrical charges includes:
selectively accumulating at least one of the first overflowed electrical charges and the second overflowed electrical charges in the floating diffusion region based on the illuminance of the incident light during the integration mode; and
accumulating the collected electrical charges in the floating diffusion region during the readout mode after the integration mode.

4. The method of claim 3, wherein selectively accumulating at least one of the first overflowed electrical charges and the second overflowed electrical charges includes:
maintaining the potential level of the floating diffusion region at the first voltage level when the illuminance of the incident light is lower than a first reference illuminance;

accumulating the first overflowed electrical charges in the floating diffusion region when the illuminance of the incident light is higher than the first reference illuminance and is lower than a second reference illuminance; and accumulating the first overflowed electrical charges and the second overflowed electrical charges in the floating diffusion region when the illuminance of the incident light is higher than the second reference illuminance.

5. The method of claim 3, wherein accumulating the collected electrical charges includes:

resetting the potential level of the floating diffusion region by the first voltage level during a first period of the readout mode; and transferring the collected electrical charges from the photoelectric conversion region to the floating diffusion region during a second period of the readout mode.

6. The method of claim 1, wherein generating the image signal includes:

generating a first sampling signal by performing correlated double sampling on the reference signal and the first output signal;

generating a second sampling signal by performing the correlated double sampling on the reference signal and the second output signal; and generating the image signal by adding the first sampling signal to the second sampling signal.

7. The method of claim 1, wherein each unit pixel further includes a reset gate and a transfer gate, wherein the potential level of the floating diffusion region is reset by the first voltage level in response to a reset signal using the reset gate, the reset signal being activated during a first period of the readout mode between the first sampling period and the second sampling period, and wherein the collected electrical charges are transferred from the photoelectric conversion region to the floating diffusion region in response to a transfer signal using the transfer gate, the transfer signal being activated during a second period of the readout mode between the second sampling period and the third sampling period.

8. The method of claim 7, wherein the reset signal and the transfer signal are deactivated during the first sampling period, the second sampling period, and the third sampling period.

9. The method of claim 1, wherein the first output signal corresponds to the potential level of the reset state of the floating diffusion region when the illuminance of the incident light is lower than a first reference illuminance, corresponds to the first overflowed electrical charges when the illuminance of the incident light is higher than the first reference illuminance and is lower than a second reference illuminance, and corresponds to the first overflowed electrical charges and the second overflowed electrical charges when the illuminance of the incident light is higher than the second reference illuminance.

10. The method of claim 9, wherein the second output signal corresponds to the collected electrical charges.

11. The method of claim 9, further comprising:

processing the image signal by dividing responses of the image sensor into a linear response and a logarithmic response according to a level of the image signal.

12. The method of claim 11, wherein processing the image signal includes:

processing the image signal based on the linear response when the level of the image signal is lower than a reference level corresponding to the second reference illuminance; and processing the image signal based on the linear response and the logarithmic response when the level of the image signal is higher than the reference level.

13. The method of claim 1, further comprising:

adjusting a start time point of the reset mode to control a dynamic range of the image sensor.

* * * * *